US012585201B2

(12) United States Patent
Elazhary et al.

(10) Patent No.: US 12,585,201 B2
(45) Date of Patent: Mar. 24, 2026

(54) METROLOGY MARK STRUCTURE AND METHOD OF DETERMINING METROLOGY MARK STRUCTURE

(71) Applicants: ASML HOLDING N.V., Veldhoven (NL); ASML NETHERLANDS B.V., Veldhoven (NL)

(72) Inventors: Tamer Mohamed Tawfik Ahmed Mohamed Elazhary, New Canaan, CT (US); Robert John Socha, Campbell, CA (US); Stephen Roux, New Fairfield, CT (US); Simon Reinald Huisman, Eindhoven (NL)

(73) Assignees: ASML HOLDING N.V., Veldhoven (NL); ASML NETHERLANDS B.V., Veldhoven (NL)

( * ) Notice: Subject to any disclaimer, the term of this patent is extended or adjusted under 35 U.S.C. 154(b) by 710 days.

(21) Appl. No.: 17/765,214

(22) PCT Filed: Sep. 25, 2020

(86) PCT No.: PCT/EP2020/076986
§ 371 (c)(1),
(2) Date: Mar. 30, 2022

(87) PCT Pub. No.: WO2021/073854
PCT Pub. Date: Apr. 22, 2021

(65) Prior Publication Data
US 2022/0350268 A1 Nov. 3, 2022

Related U.S. Application Data

(60) Provisional application No. 62/914,618, filed on Oct. 14, 2019.

(51) Int. Cl.
*G03F 7/00* (2006.01)
*G01B 11/14* (2006.01)
*G03F 9/00* (2006.01)

(52) U.S. Cl.
CPC .......... *G03F 7/70683* (2013.01); *G01B 11/14* (2013.01); *G03F 7/70633* (2013.01); *G03F 9/7046* (2013.01); *G03F 9/7076* (2013.01)

(58) Field of Classification Search
CPC ....... G01B 11/26; G01B 11/27; G01B 11/272; G01B 11/13; G01B 11/02; G01B 11/028;
(Continued)

(56) References Cited

U.S. PATENT DOCUMENTS

| | | | |
|---|---|---|---|
| 5,229,872 A | 7/1993 | Mumola | |
| 6,046,792 A | 4/2000 | Van Der Werf et al. | |

(Continued)

FOREIGN PATENT DOCUMENTS

| | | |
|---|---|---|
| CN | 109478023 | 3/2019 |
| EP | 1788451 | 5/2007 |

(Continued)

OTHER PUBLICATIONS

International Search Report and Written Opinion issued in corresponding PCT Patent Application No. PCT/EP2020/079986, dated Feb. 8, 2021.

(Continued)

*Primary Examiner* — Gordon J Stock, Jr.
(74) *Attorney, Agent, or Firm* — Pillsbury Winthrop Shaw Pittman, LLP

(57) ABSTRACT
A structure of a semiconductor device with a sub-segmented grating structure as a metrology mark and a method for configuring the metrology mark. The method for configuring a metrology mark may be used in a lithography process. The method may include determining an initial characteristic
(Continued)

function of an initial metrology mark disposed within a layer stack. The method also includes perturbing one or more variables of the plurality of subsegments of the metrology mark (e.g., pitch, duty cycle, and/or line width of the plurality of subsegments) and further perturbing a thickness of one or more layers within the layer stack. The method further includes iteratively performing the perturbations until a minimized characteristic function of an initial metrology mark is determined to set a configuration for the plurality of subsegments.

20 Claims, 19 Drawing Sheets

(58) Field of Classification Search
CPC . G01B 11/14; G03F 7/70633; G03F 7/70653; G03F 7/70683; G03F 7/706837; G03F 7/706835; G03F 7/706839; G03F 7/706841; G03F 7/706843; G03F 9/7019; G03F 9/7046; G03F 9/7073; G03F 9/7076; G03F 9/708; G03F 9/7084
See application file for complete search history.

(56) References Cited

U.S. PATENT DOCUMENTS

| | | | | |
|---|---|---|---|---|
| 7,925,486 | B2 * | 4/2011 | Smith | G06F 30/20 |
| | | | | 356/252 |
| 7,961,116 | B2 | 6/2011 | Reusser et al. | |
| 8,139,217 | B2 * | 3/2012 | Van Bilsen | G03F 9/7092 |
| | | | | 356/399 |
| 8,214,771 | B2 * | 7/2012 | Adel | G03F 7/706831 |
| | | | | 703/2 |
| 9,746,785 | B2 * | 8/2017 | Van Der Schaar | G03F 9/7076 |
| 9,804,504 | B2 * | 10/2017 | Chen | G03F 7/70641 |
| 10,296,692 | B2 * | 5/2019 | Chen | G06F 30/39 |
| 10,331,043 | B2 * | 6/2019 | Van Buel | G01N 21/93 |
| 10,527,953 | B2 * | 1/2020 | Bhattacharyya | G03F 7/705 |
| 10,551,172 | B2 * | 2/2020 | Rehman | G03F 7/70625 |
| 10,551,750 | B2 * | 2/2020 | Urbanczyk | G01N 21/47 |
| 10,578,982 | B2 * | 3/2020 | Van Der Laan | G03F 7/70675 |
| 10,656,534 | B2 * | 5/2020 | Pandey | G01B 11/02 |
| 10,691,029 | B2 * | 6/2020 | Gu | G03F 7/70633 |
| 10,788,758 | B2 * | 9/2020 | Lian | G03F 7/70158 |
| 10,831,108 | B2 * | 11/2020 | Marciano | H01L 22/20 |
| 11,079,684 | B2 * | 8/2021 | Bijnen | G03F 7/705 |
| 11,170,072 | B2 * | 11/2021 | Mos | G03F 7/70625 |
| 11,187,995 | B2 * | 11/2021 | Calado | G03F 7/70633 |
| 11,906,906 | B2 * | 2/2024 | Goorden | G03F 7/70633 |
| 11,947,269 | B2 * | 4/2024 | Tsiatmas | G03F 7/70683 |
| 12,025,925 | B2 * | 7/2024 | Alpeggiani | G03F 9/7046 |
| 12,105,432 | B2 * | 10/2024 | Javaheri | G01B 11/0633 |
| 12,117,347 | B2 * | 10/2024 | Lee | G01J 9/00 |
| 12,321,101 | B2 * | 6/2025 | Pisarenco | G03F 7/705 |
| 12,332,573 | B2 * | 6/2025 | Kooiman | G03F 7/70625 |
| 2007/0170381 | A1 | 7/2007 | Little | |
| 2008/0144048 | A1 | 6/2008 | Ikebe et al. | |
| 2009/0195768 | A1 | 8/2009 | Bijnen et al. | |
| 2012/0267802 | A1 | 10/2012 | De Boer et al. | |
| 2013/0222795 | A1 | 8/2013 | Madsen et al. | |
| 2015/0185625 | A1 | 7/2015 | Chen et al. | |
| 2015/0346605 | A1 | 12/2015 | Den Boef et al. | |
| 2015/0355554 | A1 * | 12/2015 | Mathijssen | G03F 9/7046 |
| | | | | 356/614 |
| 2016/0061589 | A1 * | 3/2016 | Bhattacharyya | G01B 11/14 |
| | | | | 356/620 |
| 2018/0017881 | A1 * | 1/2018 | Van Der Schaar | |
| | | | | G03F 7/70633 |
| 2019/0137893 | A1 | 5/2019 | Den Boef et al. | |
| 2023/0408931 | A1 * | 12/2023 | Zhang | G03F 7/70625 |

FOREIGN PATENT DOCUMENTS

| | | |
|---|---|---|
| TW | 201931023 | 8/2019 |
| WO | 2014146906 | 9/2014 |
| WO | 2015051970 | 4/2015 |
| WO | 2016030227 | 3/2016 |
| WO | 2018210505 | 11/2018 |
| WO | 2019048147 | 3/2019 |

OTHER PUBLICATIONS

Taiwanese Office Action issued in corresponding Taiwanese Patent Application No. 109135267, dated Oct. 7, 2021.

* cited by examiner 13E                 13W

13NW                                        13SE

1000

METROLOGY MARK STRUCTURE AND METHOD OF DETERMINING METROLOGY MARK STRUCTURE

CROSS-REFERENCE TO RELATED APPLICATION

The application is the U.S. national phase entry of PCT Patent Application No. PCT/EP2020/076986, which was filed on Sep. 25, 2020, which claims the benefit of priority of U.S. Provisional Application No. 62/914,618, which was filed on Oct. 14, 2019 and which is incorporated herein in its entirety by reference.

TECHNICAL FIELD

The description herein relates generally to improved mark structures that can be used for alignment, overlay or other measurement purposes and methods for application in a lithography process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of a die, one die, or several dies) on a substrate (e.g., a silicon wafer). Transfer of the pattern is typically via imaging onto a layer of radiation-sensitive material (resist) provided on the substrate. In general, a single substrate contains a plurality of adjacent target portions to which the pattern is transferred successively by the lithographic apparatus, one target portion at a time. In one type of lithographic apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices can be found in, for example, U.S. Pat. No. 6,046,792, incorporated herein by reference. In general, a single substrate will contain a network of adjacent target portions that are successively patterned.

The manufacture of complex devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device-manufacturing process may be considered a patterning process.

A patterning process involves a patterning step, such as optical and/or nanoimprint lithography using a patterning device in a lithographic apparatus, to transfer a pattern on the patterning device to a substrate and typically, but optionally, involves one or more related pattern-processing steps, such as resist development by a development apparatus, baking of the substrate using a bake tool, etching using the pattern using an etch apparatus, etc.

As noted, lithography is a central step in the manufacturing of devices such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

One aspect of the performance of the lithographic apparatus is the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor (e.g., an alignment sensor), typically an optical position sensor. The lithographic apparatus includes one or more alignment sensors by which positions of marks on a substrate can be measured accurately. Different types of marks and different types of alignment sensors are known from different manufacturers and different products of the same manufacturer. A type of sensor used in some lithographic apparatus is based on a self-referencing interferometer as described in U.S. Pat. No. 7,961,116 (den Boef et al). Generally, marks are measured separately to obtain X- and Y-positions. However, combined X and Y measurements can be performed using the techniques described in published patent application US 2009/195768 A (Bijnen et al). Modifications and applications of such sensors are described in US2015355554A1 (Mathijssen), WO20150511070A1 (Tinnemans et al), WO2018210505A1 (Goorden et al). The contents of all of the above five publications are incorporated herein by reference in their entirety, as it will be appreciated that the subject matter thereof can be used in combination or in connection with the alignment marks and/or methods contained in this disclosure.

SUMMARY

The present disclosure addresses various problems discussed above. In a first aspect, the present disclosure provides an improved measurement method of determining the position of the metrology mark on a substrate in the lithography process. In another aspect overlay control and process robustness can be improved.

The present disclosure sets forth a number of improvements in the design of the metrology mark on a substrate in a lithography process. The present disclosure also addresses the accuracy of the determination of the position of the metrology mark on the substrate caused by the stack of layers on the layer containing the metrology mark (e.g., caused by the change of the angular reflectance and the change in a wavelength of the reflected beam, etc.) mentioned above, among others. The present disclosure also sets forth a method of reducing measurement sensitivity to a linear apodization effect of non-zeroth diffraction orders of the reflected beams caused by the stack of layers on the layer containing the metrology mark by using the sub-segmented grating structure. The present disclosure also sets forth a method of creating or modifying a metrology mark in a matter that avoids some of the process variations introduced by the stack of layers on top of the mark.

In one embodiment, the present disclosure sets forth a semiconductor device that includes a substrate, and the substrate includes a stack of a plurality of layers. The semiconductor device also includes a metrology mark disposed within the stack. The metrology mark includes a plurality of mark segments. At least one of the mark segments includes a plurality of subsegments. The plurality of subsegments may be configured with a pitch, duty cycle, line width and/or combination thereof to minimize a characteristic function produced by the metrology mark.

In some variations, the characteristic function may include a change in a wavelength of a reflected beam with respect to the wavelength of an incident radiation as a function of a change in thickness of the stack.

In some variations, the characteristic function may include a change in the angular reflectance of the reflected beam as a function of a change in thickness of the stack.

In another embodiment, the present disclosure sets forth a method of configuring a metrology mark for use in a lithography process, that comprises: a) determining an initial characteristic function of an initial metrology mark disposed within a layer stack, the initial metrology mark comprising a plurality of mark segments, at least one of the mark segments comprising a plurality of subsegments; b) perturbing one or more variables of the plurality of subsegments, wherein the one or more variables comprise pitch, duty cycle, and/or line width of the plurality of subsegments; c) perturbing a thickness of one or more layers within the layer stack; d) determining an updated characteristic function based upon the perturbations of b) and c); and iteratively performing steps b), c) and d) until a minimized characteristic function is determined to set a configuration for the plurality of subsegments.

In some variations, the pitch and duty cycle remain constant and the line width of the plurality of subsegments is varied.

In some variations, the pitch and line width remain constant and the duty cycle of the plurality of subsegments is varied.

In some variations, the line width and duty cycle remain constant and the pitch of the plurality of subsegments is varied.

In some variations, iteratively performing a predetermined number of times of the perturbations until a minimized characteristic function is reached.

In one embodiment, the present disclosure sets forth a semiconductor device that includes a substrate, and the substrate includes a stack of a plurality of layers. The semiconductor device also includes a metrology mark disposed within the stack. The metrology mark includes a plurality of mark segments. At least one of the mark segments includes a plurality of subsegments. The plurality of subsegments may be configured with a pitch, duty cycle, line width and/or combination thereof to maximize a characteristic function produced by the metrology mark.

In another embodiment, the present disclosure sets forth a method of obtaining a substrate comprising a first mark and a second mark, the first mark disposed on a first layer of the substrate, the second mark disposed on a second layer of the substrate, wherein at least one of the first mark and the second mark includes: a plurality of mark segments; wherein at least one of the mark segments comprises a plurality of subsegments; wherein the plurality of subsegments are configured with a pitch, duty cycle, line width and/or combination thereof to minimize a characteristic function produced by the first mark and the second mark; obtaining, via a metrology tool, a first signal associated with the first mark and a second signal associated with the second mark; and determining, via a processor, an overlay measurement based on the first signal and the second signal.

According to an embodiment, there is provided a computer program product comprising a non-transitory, computer-readable medium having instructions recorded thereon. The instructions, when executed by a computer, implement the methods listed in the claims.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed embodiments. In the drawings.

DETAILED DESCRIPTION

Figure 1:
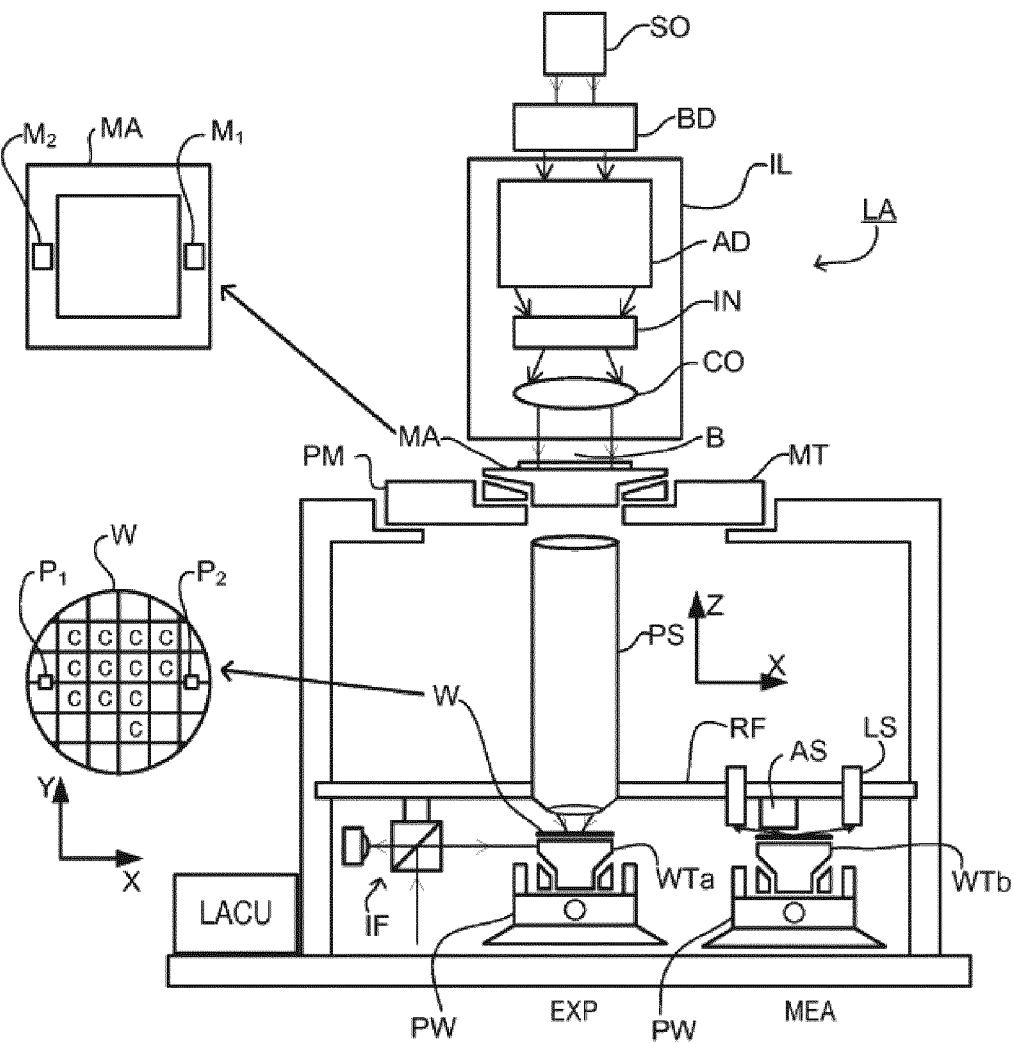
FIG. 1 illustrates a lithographic apparatus, according to an embodiment.

The present disclosure will now be described in detail with reference to the drawings, which are provided as illustrative examples of the disclosure so as to enable those skilled in the art to practice the disclosure. Notably, the figures and examples below are not meant to limit the scope of the present disclosure to a single embodiment, but other embodiments are possible by way of interchange of some or all of the described or illustrated elements. Moreover, where certain elements of the present disclosure can be partially or fully implemented using known components, only those portions of such known components that are necessary for an understanding of the present disclosure will be described, and detailed descriptions of other portions of such known components will be omitted so as not to obscure the disclosure. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present disclosure encompasses present and future known equivalents to the known components referred to herein by way of illustration.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as interchangeable with the more general terms "mask," "substrate" and "target portion," respectively.

In the present document, the terms "radiation" and "beam" used herein encompass all types of electromagnetic radiation, including visible radiation (for example, having a wavelength in the range of 400 to 780 nm), ultraviolet (UV) radiation (for example, having a wavelength of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between devices (such as gates, capacitors, etc.) or interconnect lines, so as to ensure that the devices or lines do not interact with one another in an undesirable way. One or more of the design rule limitations may be referred to as "critical dimension" (CD). A critical dimension of a device can be defined as the smallest width of a line or hole or the smallest space between two lines or two holes. Thus, the CD determines the overall size and density of the designed device. Of course, one of the goals in device fabrication is to faithfully reproduce the original design intent on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include a programmable mirror array and a programmable LCD array.

An example of a programmable mirror array can be a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The matrix addressing can be performed using suitable electronic means. An example of a programmable LCD array is given in U.S. Pat. No. 5,229,872, which is incorporated herein by reference.

FIG. 1 is schematically a lithographic apparatus. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as desired. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so-called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index (e.g., water) so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example when the source is a mercury lamp. The source SO and the illuminator IL, together with the beam delivery system BD if used, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers, is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above-described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2A:
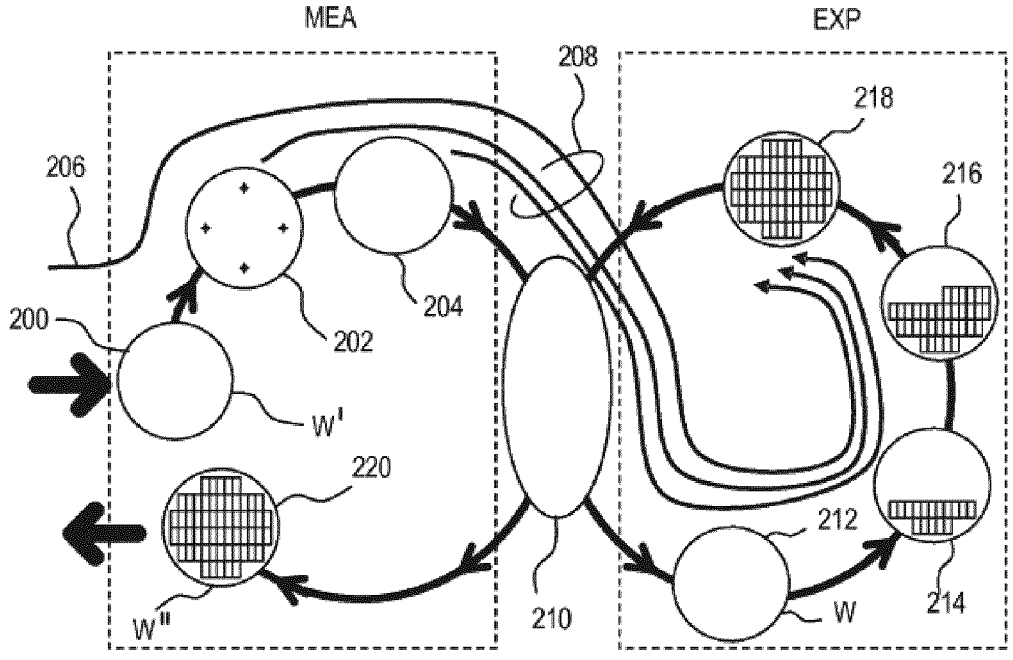
FIG. 2A illustrates schematically measurement and exposure processes in the apparatus of FIG. 1, according to an embodiment.

FIG. 2A illustrates schematically measurement and exposure processes in the apparatus of FIG. 1 which includes the steps to expose target portions (e.g. dies) on a substrate W in the dual stage apparatus of FIG. 1. On the left-handed side within a dotted box steps are performed at a measurement station MEA, while the right-handed side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the purpose of improving overlay performance, the task is to ensure that new patterns are applied in the correct position on a substrate that has already been subjected to one or more cycles of patterning and processing. These processing steps progressively introduce distortions in the substrate that can be measured and corrected for to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore, some layers may be exposed in an immersion-type lithography tool, while others are exposed in a "dry" tool. Some layers may be exposed in a tool working at DUV wavelengths, while others are exposed using EUV wavelength radiation.

At 202, alignment measurements using the substrate marks P1, etc., and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid," which maps very accurately the distribution of marks across the substrate, including any distortion relative to a nominal rectangular grid.

At step 204, a map of wafer height (Z) against the X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. These recipe data are added to the measurements of wafer position, wafer grid, and height map that were made at 202, 204, and then a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the "ideal" grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station, and the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example, rather than measuring alignment in a single pass, often there will be separate phases of coarse and fine measurement, using the same or different marks. The coarse and/or fine alignment measurement steps can be performed before or after the height measurement, or interleaved.

In one embodiment, optical position sensors, such as alignment sensor AS, use visible and/or near-infra-red (NIR) radiation to read alignment marks. In some processes, processing of layers on the substrate after the alignment mark has been formed leads to situations in which the marks cannot be found by such an alignment sensor due to low or no signal strength.

Figure 2B:
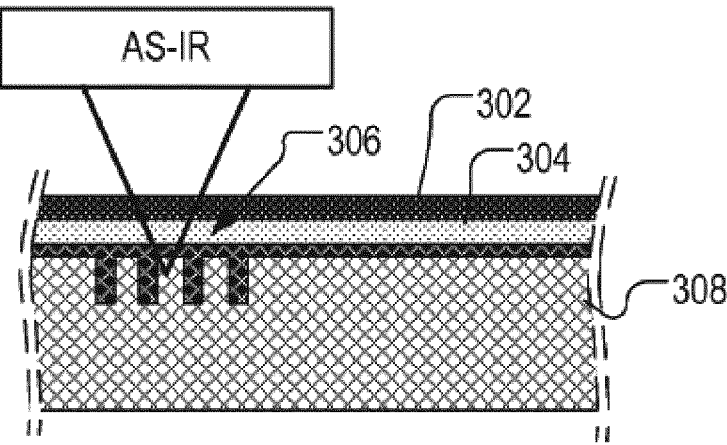
FIG. 2B illustrates schematically the use of a position sensor to measure the position of a metrology mark on a substrate, according to an embodiment.

FIG. 2B illustrates schematically the use of a position sensor (e.g., an alignment sensor AS) to measure the position of an alignment mark 306 on a substrate 308. The alignment sensor AS-IR can use a much longer (than normally used for transparent layer) wavelength of radiation that can penetrate an opaque layer 302. The opaque layer 302 is formed over other material layers 304 and alignment mark 306 on substrate 308. Currently, alignment sensors operate at wavelengths between 500-1000 nm. While this wavelength range includes infrared wavelengths near to the visible range, these are unable to penetrate common opaque layers. Transmission through such opaque layers is relatively high for longer IR wavelengths. To mitigate this, an alignment sensor AS-IR which can operate for example using radiation of wavelengths longer than 1000 nm, for example in the range between 1500-2500 nm, may be provided that will be transmitted to a greater extent through such opaque layers. The alignment mark 306 may be a conventional alignment mark, with conventional pitch or may be a special mark with, as discussed herein.

In an embodiment, the alignment mark 306 may be a grating structure including a plurality of segments, where a segment may be further sub-segmented to form a sub-segmented grating. In an embodiment, the sub-segmented grating may have following physical characteristics: (i) a constant pitch, a variable duty cycle, and a variable line width; (ii) a constant duty cycle, a variable pitch, and a variable line width; (iii) a constant line width, a variable duty cycle, and a variable pitch; or a combination thereof.

Figure 3A:
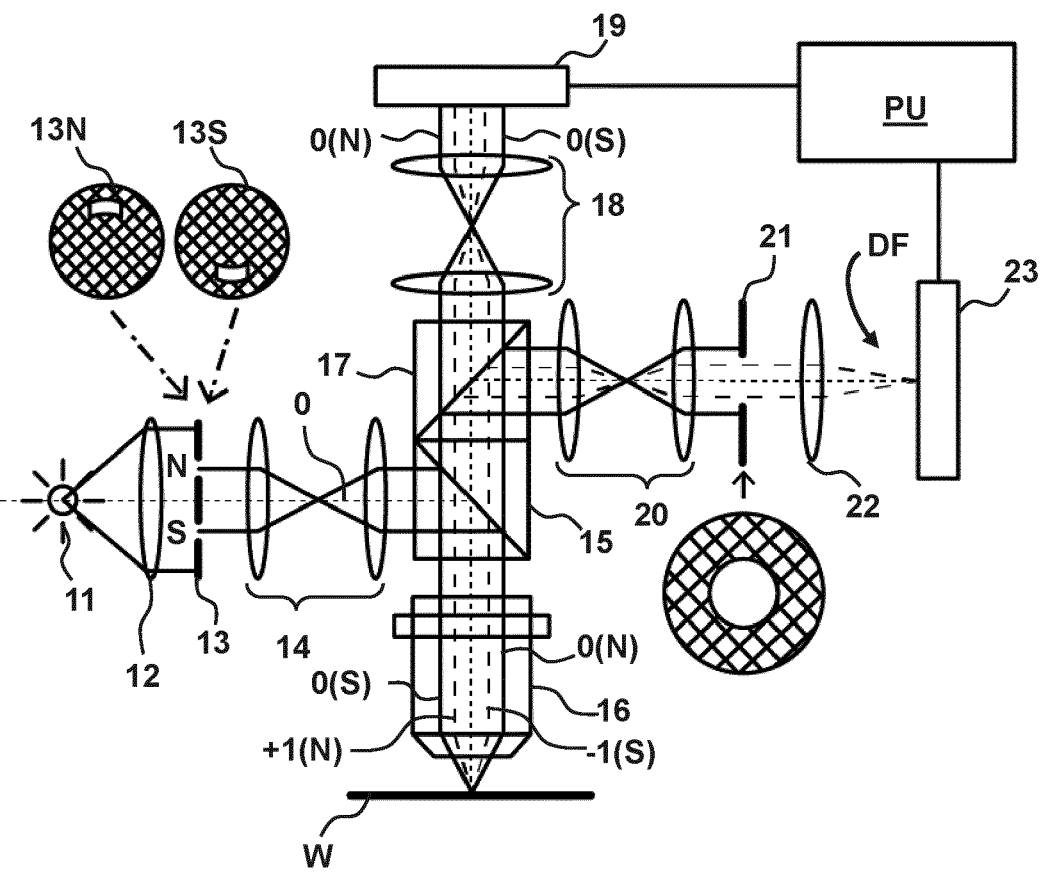
FIG. 3A is schematic diagram of a measurement apparatus for use in measuring targets according to an embodiment using a first pair of illumination apertures providing certain illumination modes.

FIG. 3A is schematic diagram of a measurement apparatus for use in measuring targets according to an embodiment using a pair of illumination apertures providing certain illumination modes. A metrology apparatus suitable for use in embodiments to measure, e.g., overlay is also schematically shown in FIG. 3A. A target T (comprising a periodic structure such as a grating) on the substrate W, and diffracted rays, are illustrated in more detail in FIG. 3B. The metrology apparatus may be a stand-alone device or incorporated in either the lithographic apparatus LA (See FIG. 1). An optical axis, which has several branches throughout the apparatus, is represented by a dotted line O. In this apparatus, radiation emitted by an output source 11 (e.g., a source such as a laser or a xenon lamp or an opening connected to a source) is directed onto substrate W via a prism 15 by an optical system comprising lenses 12, 14 and objective lens 16. These lenses are arranged in a double sequence of a 4F arrangement. A different lens arrangement can be used, provided that it still provides a substrate image onto a detector.

In an embodiment, the lens arrangement allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done, for example, by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In a first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark, as any unnecessary radiation outside the desired illumination mode may interfere with the desired measurement signals.

Figure 3B:
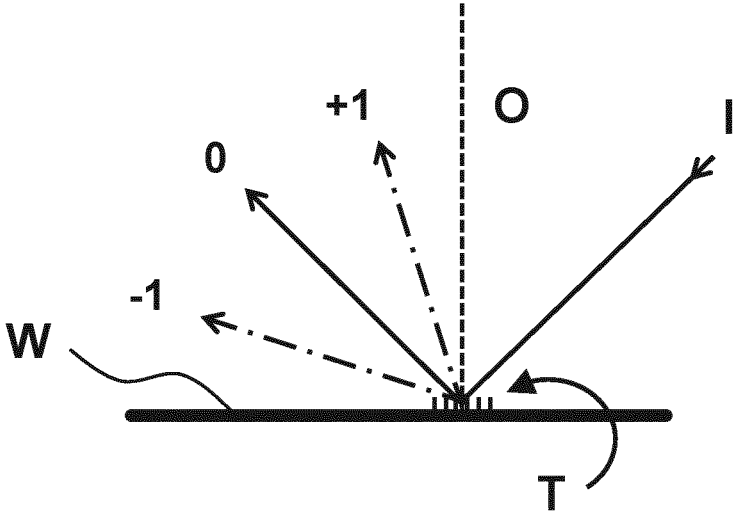
FIG. 3B is a schematic detail of a diffraction spectrum of a target for a given direction of illumination.

FIG. 3B is a schematic detail of a diffraction spectrum of a target for a given direction of illumination. As shown in FIG. 3B, target T is placed with substrate W substantially normal to the optical axis O of objective lens 16. A ray of illumination I impinging on target T from an angle off the axis O gives rise to a zeroth order ray (solid line 0) and two first order rays (dot-chain line +1 and double dot-chain line −1). With an overfilled small target T, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in FIGS. 3A and 3B are shown somewhat off axis, purely to enable them to be more easily distinguished in the diagram. At least the 0 and +1 orders diffracted by the target on substrate W are collected by objective lens 16 and directed back through prism 15.

Returning to FIG. 3A, both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16. Thus, in an embodiment, measurement results are obtained by measuring the target twice under certain conditions, e.g., after rotating the target or changing the illumination mode or changing the imaging mode to obtain separately the −1st and the +1st diffraction order intensities. Comparing these intensities for a given target provides a measurement of asymmetry in the target, and asymmetry in the target can be used as an indicator of a parameter of a lithography process, e.g., overlay. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams Each diffraction order hits a different point on the sensor, so that image processing can compare and contrast orders. The pupil plane image captured by sensor 19 can be used for focusing the metrology apparatus and/or normalizing intensity measurements. The pupil plane image can also be used for other measurement purposes such as reconstruction, as described further hereafter.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane of the objective lens 16. Aperture stop 21 functions to block the zeroth order diffracted beam so that the image of the target formed on sensor 23 is formed from the −1 or +1 first order beam. Data regarding the images measured by sensors 19 and 23 are output to processor and controller PU, the function of which will depend on the particular type of measurements being performed. Note that the term 'image' is used in a broad sense. An image of the periodic structure features (e.g., grating lines) as such will not be formed, if only one of the −1 and +1 orders is present.

The particular forms of aperture plate 13 and stop 21 shown in FIG. 3 are purely examples. In another embodiment, on-axis illumination of the target is used and an aperture stop with an off-axis aperture is used to pass substantially only one first order of diffracted radiation to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S are used to measure a periodic structure of a target oriented in one direction (X or Y depending on the set-up). For measurement of an orthogonal periodic structure, rotation of the target through 90° and 270° might be implemented.

Figure 3C:
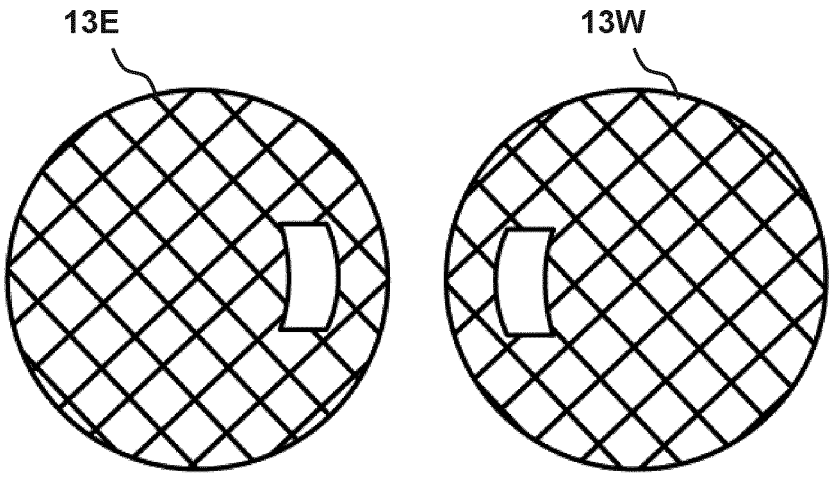
FIG. 3C is a schematic illustration of a second pair of illumination apertures providing further illumination modes in using a measurement apparatus for diffraction based overlay measurements.

FIG. 3C is a schematic illustration of a second pair of illumination apertures providing further illumination modes in using a measurement apparatus for diffraction based overlay measurements.

Figure 3D:
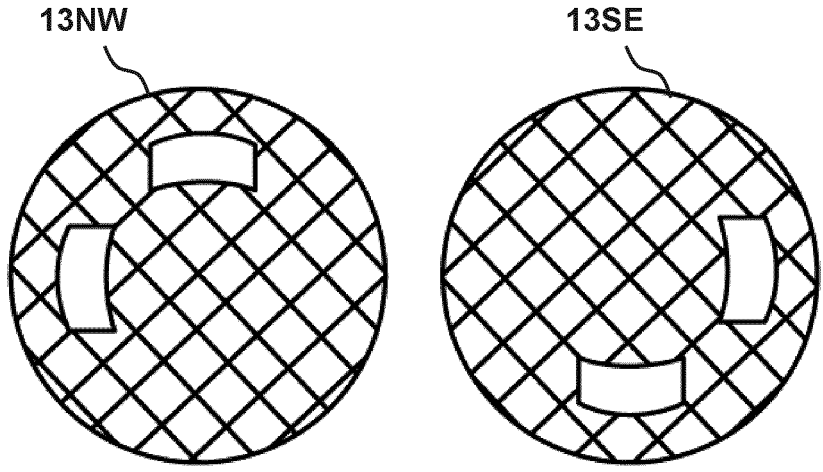
FIG. 3D is a schematic illustration of a third pair of illumination apertures combining the first and second pairs of apertures providing further illumination modes in using a measurement apparatus for diffraction based overlay measurements.

FIG. 3D is a schematic illustration of a third pair of illumination apertures combining the first and second pairs of apertures providing further illumination modes in using a measurement apparatus for diffraction based overlay measurements.

Different aperture plates are shown in FIGS. 3C and D. FIG. 3C illustrates two further types of off-axis illumination mode. In a first illumination mode of FIG. 3C, aperture plate 13E provides off-axis illumination from a direction designated, for the sake of description only, as 'east' relative to the 'north' previously described. In a second illumination mode of FIG. 3C, aperture plate 13W is used to provide similar illumination, but from an opposite direction, labeled 'west'. FIG. 3D illustrates two further types of off-axis illumination mode. In a first illumination mode of FIG. 3D, aperture plate 13NW provides off-axis illumination from the directions designated 'north' and 'west' as previously described. In a second illumination mode, aperture plate 13SE is used to provide similar illumination, but from an opposite direction, labeled 'south' and 'east' as previously described. The use of these, and numerous other variations and applications of the apparatus are described in, for example, the prior published patent application publications mentioned above.

Figure 4A:
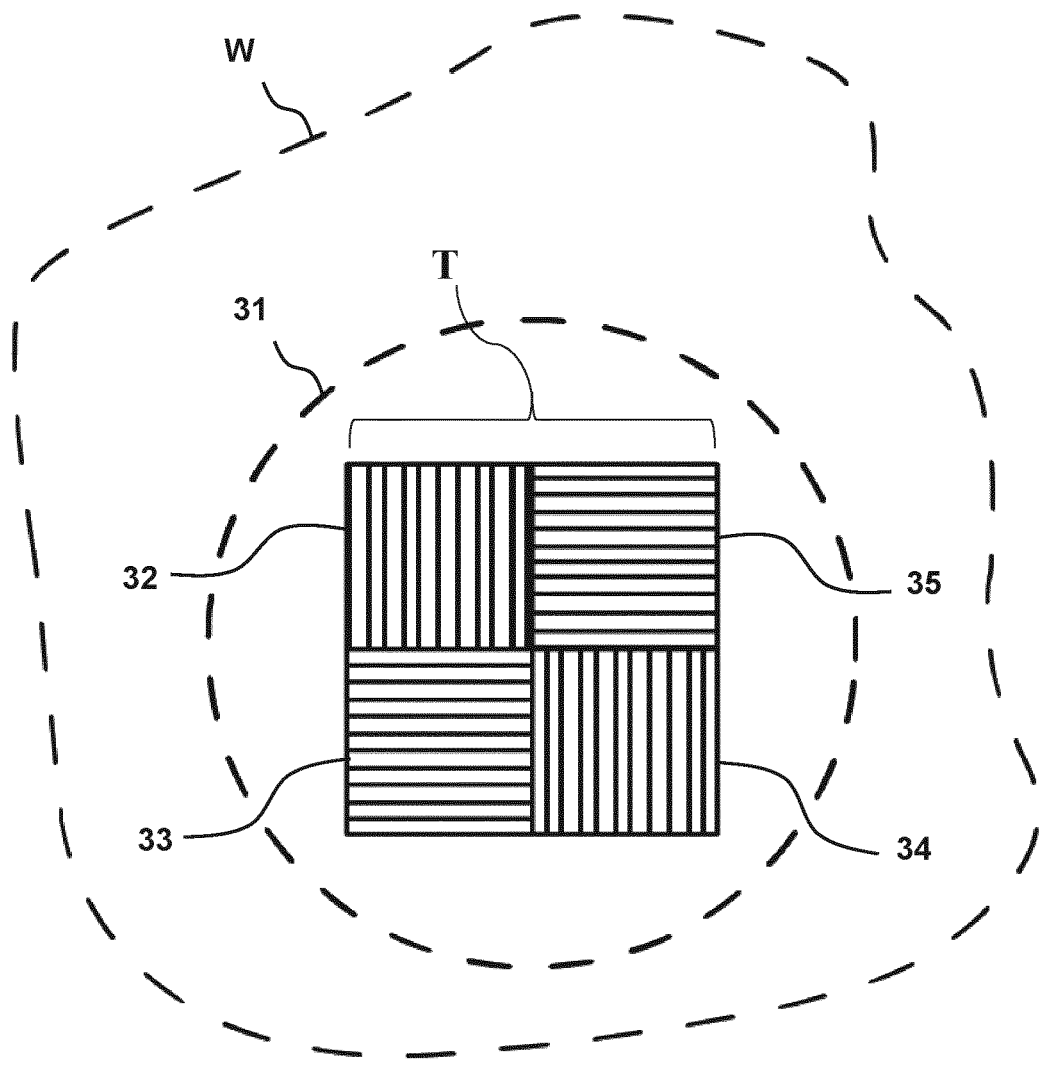
FIG. 4A schematically depicts a form of multiple periodic structure target and an outline of a measurement spot on a substrate.

FIG. 4A schematically depicts a form of multiple periodic structure (e.g., multiple grating) target and an outline of a measurement spot on a substrate.

FIG. 4A depicts an example composite metrology target T formed on a substrate. The composite target comprises four periodic structures (in this case, gratings) 32, 33, 34, 35 positioned closely together. In an embodiment, the periodic structure layout may be made smaller than the measurement spot (e.g., the periodic structure layout is overfilled). Thus, in an embodiment, the periodic structures are positioned closely together enough so that they all are within a measurement spot 31 formed by the illumination beam of the metrology apparatus. In that case, the four periodic structures thus are all simultaneously illuminated and simultaneously imaged on sensors 19 and 23 (See FIG. 3A). In an example dedicated to overlay measurement, periodic structures 32, 33, 34, 35 are themselves composite periodic structures (e.g., composite gratings) formed by overlying periodic structures, e.g., periodic structures are patterned in different layers of the device formed on substrate W and such that at least one periodic structure in one layer overlays at least one periodic structure in a different layer. Such a target may have outer dimensions within 20 μm×20 μm or within 16 μm×16 μm. Further, all the periodic structures are used to measure overlay between a particular pair of layers. To facilitate a target being able to measure more than a single pair of layers, periodic structures 32, 33, 34, 35 may have differently biased overlay offsets in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the different bias facilitates distinguishing between the layer pairs.

Returning to FIG. 4A, periodic structures 32, 33, 34, 35 may also differ in their orientation, as shown, so as to diffract incoming radiation in X and Y directions. In one example, periodic structures 32 and 34 are X-direction periodic structures with biases of +d, −d, respectively. Periodic structures 33 and 35 may be Y-direction periodic structures with offsets +d and −d respectively. While four periodic structures are illustrated, another embodiment may include a larger matrix to obtain desired accuracy. For example, a 3×3 array of nine composite periodic structures may have biases −4d, −3d, −2d, −d, 0, +d, +2d, +3d, +4d. Separate images of these periodic structures can be identified in an image captured by sensor 23.

Figure 4B:
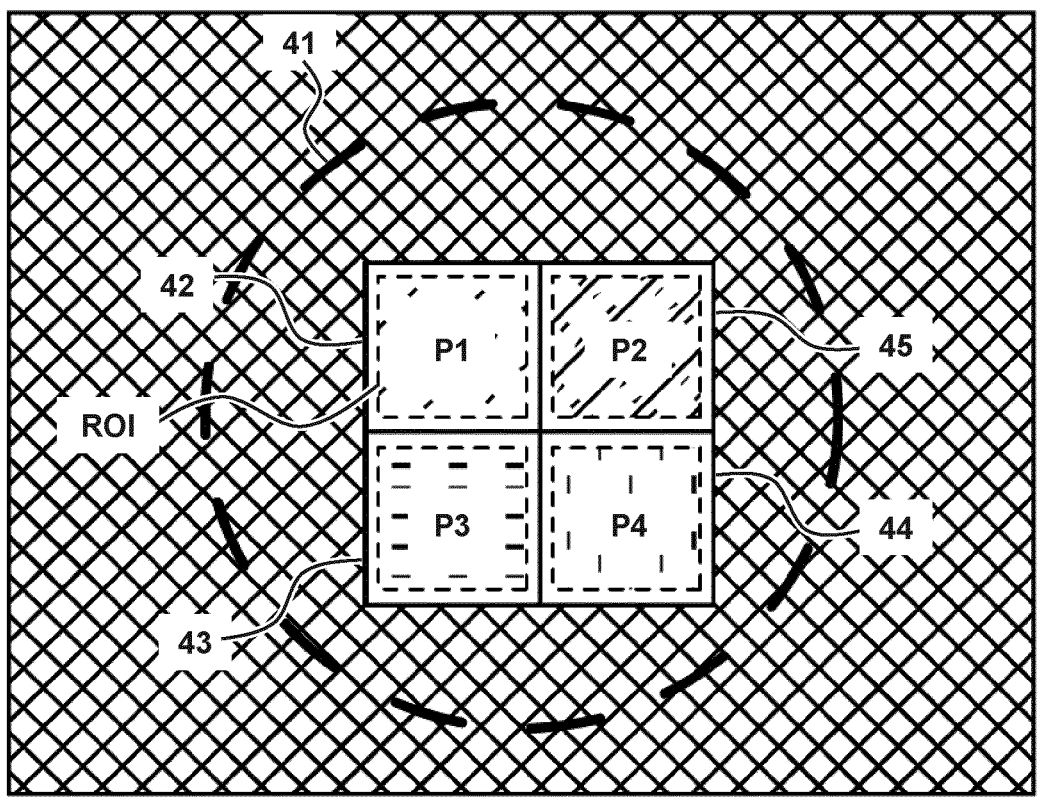
FIG. 4B schematically depicts an image of the target of FIG. 4A obtained in the apparatus of FIG. 3.

FIG. 4B schematically depicts an image of the target of FIG. 4A obtained in the apparatus of FIG. 3A. FIG. 4B shows an example of an image that may be formed on and detected by the sensor 23 (See FIG. 3A), using the target of FIG. 4A in the apparatus of FIG. 3A, using the aperture plates 13NW or 13SE from FIG. 3D. While the sensor 19 cannot resolve the different individual periodic structures 32 to 35, the sensor 23 can do so. The dark rectangle represents the field of the image on the sensor, within which the illuminated spot 31 on the substrate is imaged into a corresponding circular area 41. Within this, rectangular areas 42-45 represent the images of the periodic structures 32 to 35. The target can be positioned in among device product features, rather than or in addition to in a scribe lane. If the periodic structures are located in device product areas, device features may also be visible in the periphery of this image field. Processor and controller PU process these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay measurement is an example of such a parameter. In an embodiment, the periodic structures 32 to 35 can be optimized to be used for an overlay measurement to minimize change of the angular reflectance of the beam reflected off the periodic structures 32 to 35, and a minimal change in a wavelength of the beam reflected off the periodic structures 32 to 35.

Figure 4C:
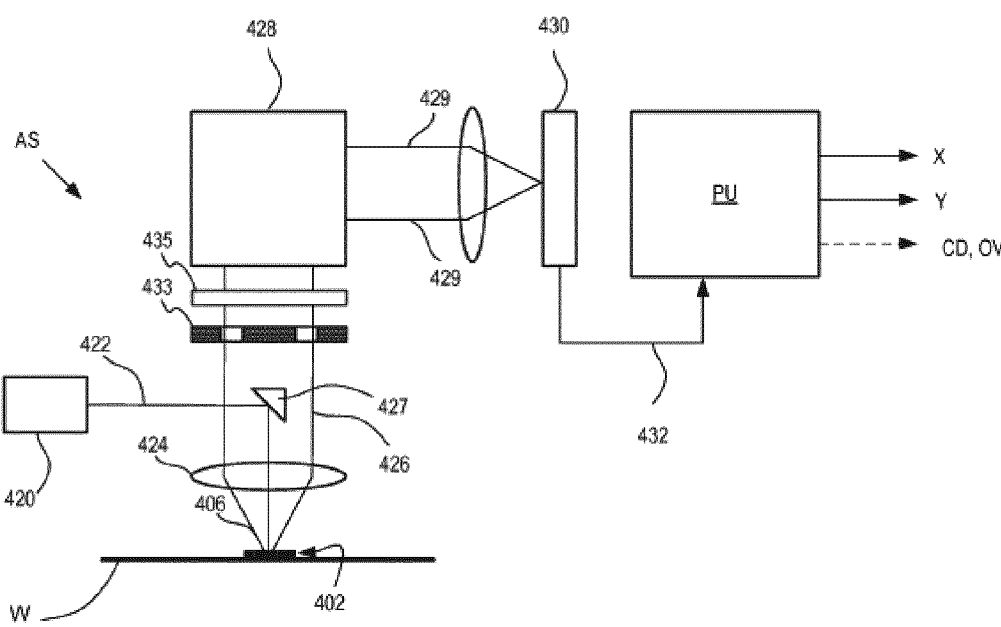
FIG. 4C illustrates a schematic drawing of a position sensor, according to an embodiment.

FIG. 4C illustrates a simplified, schematic drawing of an example of a position sensor or alignment sensor according to one example of the present disclosure as shown in FIG. 4C. Illumination source 420 provides a beam 422 of radiation of one of more wavelengths, which is diverted through an objective lens 424 via a spot mirror 427 onto an alignment mark such as alignment mark 402, located on substrate W. Radiation 406 scattered by alignment mark 402 is picked up by objective lens 424 and collimated into an information-carrying beam 426. An optical analyzer 428 processes beam 426 and outputs separate beams 429 onto a detection system (e.g., sensor array) 430 (e.g., via an optical fiber). Intensity signals 432 from individual sensors in detection system 430 are provided to a processing unit PU. By a combination of the optical processing in the system 428 and the computational processing in the unit PU, values for the X- and Y-position on the substrate relative to the sensor are output. Alternatively, or in addition, other parameters may be measured such as overlay OV and/or critical dimension CD.

Details of the construction and operation of such an alignment sensor can be found in the previously mentioned patent publications in the introduction, and will not be repeated here Briefly, in the illumination path 422, there may be provided a plurality of individual wavelength sources such as LEDs or laser sources. The sources may be arranged to supply different wavelengths of radiation, for example one or more of green and red visible light, near infrared (NIR) wavelengths and/or infrared radiation in the range 1500-2500 nm, optionally including a wavelength having a wavelength longer than 2000 nm. Sources can include LEDs, lasers, gas discharge sources, plasma sources, supercontinuum sources and inverse Compton scattering sources.

Radiation 426 reflected and diffracted by the alignment mark 402 is collected by the objective lens 424. While the collected radiation 426 is illustrated as a single beam on the optical axis, this information-carrying beam is actually spread out by scattering and diffraction. An axial component representing a noise signal is at least partially blocked by the spot mirror 427, which thus acts as an obscuration for blocking some of this noise signal. The remaining higher order diffracted radiation (and some stray noise signal) then enters a processing system 428, optionally via an obscuration (spatial filter or pupil filter) 433.

Spatial filter 433 controls which portions of the reflected and diffracted radiation are admitted into the processing system, additional to any spatial filtering provided by the spot mirror 427 and natural aperture of the objective lens 424. In particular, the spot mirror may be insufficiently sized to sufficiently suppress the zeroth order radiation. In the embodiment shown, spatial filter 433 comprises apertures 441 for passing only the desired corresponding non-zero diffraction orders (e.g., at least the +1 and −1 diffraction orders) in both the X and Y directions. The central region is opaque and, as such, acts as an additional zero-order block which blocks stray radiation not blocked by spot mirror 427. However, this zeroth order suppression may still be insufficient with increasingly low wafer quality.

The nature of the processing system 428 will depend on the desired performance and the type of mark provided. The processing system 428 may be based on interferometry, or on imaging, or on a combination of techniques. The processing system 428 may be substantially the same type as one another, or they may be completely different types. In the present example, it will be assumed that the processing system is based on interferometry, and comprises a self-referencing interferometer of the type described in the references.

The processing system 428 may comprise a self-referencing interferometer which receives the collected radiation 426. At the entrance of the interferometer 428, a half-wave plate 435 conditions the polarization of the radiation to 45 degrees. The interferometer then processes it in the manner described in the references, interfering the beam with a rotated copy of itself so that opposite diffraction orders interfere constructively and destructively. A polarizing beam splitter separates "sum" and "difference" channels, which provide the position-sensitive optical signals 429 to a detection system 430. The detection system 430 may include for each of the sum and difference channels, photodetectors for obtaining the desired electrical position signals 432. Where the waveband contains multiple wavelengths or wavelength ranges, then wavelength demultiplexers are included in the detection system, and individual photodetectors are provided to obtain an electrical signal 432 for each wavelength or wavelength range.

Due to the low wafer quality when aligning through some layers (e.g., opaque layers), signal levels may be orders of magnitude lower than typical alignment sensor signal levels when aligning through transparent layers. Wafer quality is a measure (ratio) of the actual alignment signal strength with reference to a signal generated by a fiducial mark. A corresponding improvement in the suppression of a noise signal can be used to achieve acceptable alignment performance. This is particularly the case with fine positioning (e.g., fine wafer alignment FIWA) on alignment marks with a relatively small pitch already described, blocking of the noise signal (stray or zero-order radiation) is largely performed by zero-order blocking, by spot mirror 427 and/or spatial filter 433. However, it is undesirable to make any obscuration within the alignment sensor module very large because it reduces the pitch flexibility of the alignment sensor and, in particular, complicates its coarse positioning (e.g., coarse wafer alignment COWA) ability. The relatively large pitch of the alignment mark 448 used for coarse alignment limits the size of any zero-order block (e.g., spot mirror 427 or spatial filter 433) to ensure that the actual diffraction orders, and therefore the alignment signal, are not blocked (the diffraction angle being relatively small for the larger alignment mark pitch).

Figure 5:
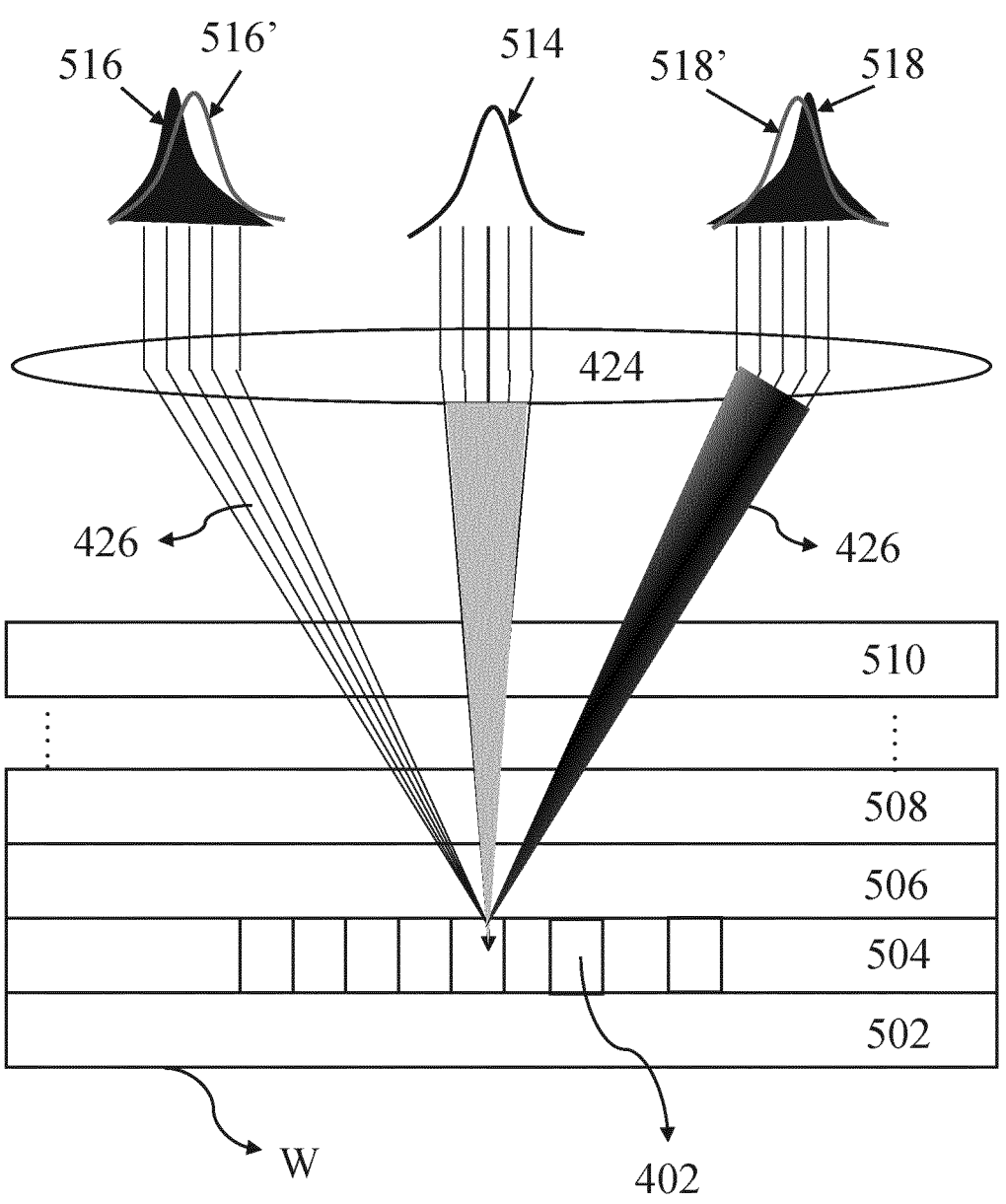
FIG. 5 illustrates schematically a reflected beam passing through a stack of layers on the layer containing a metrology mark, according to an embodiment.

FIG. 5 illustrates, schematically, an example measurement system and problems associated a measurement (e.g., a position of the alignment mark 402) related to a wafer W. In an embodiment, a position sensor and substrate having metrology mark (e.g., the alignment mark 402) are deployed in the measurement system of FIG. 5. In the present example, the measurement system includes the objective lens 424, an incident beam 514 (also referred as an incoming beam or an energy distribution of the incoming beam) focused, through the objective lens 424, on to the wafer W including the alignment mark 402. The alignment mark 402 generates the reflected beams 426 (also referred as the information carrying beams 426). The information carrying beam 426 are further analyzed to determine a measurement such as a position of the alignment mark 402 on the wafer W.

In an embodiment, the information carrying beam 426, after passing through the objective lens 424, may be characterized by an intensity distribution or an energy distribution (e.g., 516, 518) of the reflected beam. Also, information associated with the information carrying beam 426 can be a wavelength, frequency, phase, amplitude, a diffraction order, an angle of reflection, or other spectral and angular content associated with a reflected beam. In an embodiment, the information carrying beam 426 is characterized by a first energy distribution 516 and a second energy distribution 518 of reflected beams 426 shown at the right and left (in FIG. 5), respectively. These distributions 516, 518 are interchangeably referred as the reflected beams 516, 518 hereinafter.

In an embodiment, the incoming beam 514 passes through the objective lens 424, travels through the stack of layers 506, 508, 510, and impinges on top of a layer 504. The layer 504 includes a metrology mark such as the alignment mark 402. In an embodiment, the layer 504 can also be referred as a mark layer (e.g., a mark layer 504), where the mark layer can be any layer including a metrology mark such as an alignment mark and/or an overlay mark. The incoming radiation 514 is reflected from the alignment mark 402, as reflected beams 426 (or 516) (e.g., −1st diffractive order beam) and 426 (or 518) (e.g., +1st diffractive order beam). The reflected beams 426 can include multiple diffraction orders, for example the higher/non-zeroth diffractive orders (e.g., the +1st and −1st diffractive orders), with the zeroth order blocked. The zeroth order may be blocked to avoid degrading the depth of modulation available in a detected signal. The reflected beams 426 first pass through the stack of layers 506, 508, and 510 before reaching the objective lens 424, meaning the reflected beams 426 interact with the stack of layers 506, 508, and 510.

When the reflected beams 426 interact with the stack of layers 506, 508, and 510, the interaction may cause apodization of the reflected beams 426, for example, at each reflection angle of the reflected beam. Apodization refers to non-uniformity in a light intensity distribution. In other words, the reflected beams 426, after interacting with the stack layers (and before reaching back to the objection lens 424), has a non-uniformity in the light intensity distribution. An example of apodization can be visualized as a shift in center of gravity of an intensity distribution with respect to a reference light intensity distribution (e.g., having peak at a center of a Gaussian distribution). For example, 516 (or

518) has a shifted (e.g., towards left) center of gravity with respect to a reference distribution such as dotted lines 516' (or 518'). In an embodiment, the shifted intensity distribution 516 (or 518) has a peak intensity that is shifted towards left (or right) with respect to a peak of 516' (or 518'). In an embodiment, the intensity distribution 514/516'/518' may be a Gaussian distribution, a normal distribution, or the like.

In an embodiment, the apodization can be characterized by reflectance (R) or angular reflectance (ΔR) of the reflected beam. In an embodiment, reflectance is a measure of how effective a layer (or a stack of layer) is in reflecting the incident beam, while angular reflectance is an angular content of the reflectance. In an embodiment, an angular reflectance refers to a rate of change of the reflectance of a reflected beam with respect to a reflection angle (θ), where the reflection angle is an angle between the reflected beam and an illumination radiation (also referred as an incident beam). In an embodiment, a metrology mark having a grating structure in the stack of layer affects the angular reflectance. For example, depending on the physical characteristics of the grating structure, the angular reflectance may change.

In an embodiment, the intensity distribution e.g., 514/516'/518' are typically associated with a beam having a particular wavelength, also referred as a central wavelength. The central wavelength refers to a wavelength of the beam associated with approximately a peak intensity value. Accordingly, in an embodiment, the beam (e.g., 514 or 426) can be characterized by a central wavelength (e.g., 500 nm). Furthermore, any shift in a peak intensity will be associated with a shifted central wavelength (e.g., 500.1 nm). In an embodiment, the central wavelength of 518' shifts towards right according to the distribution 518. For example, the reflected beam having 500 nm central wavelength is shifted to a 500.1 nm due to interaction with the stack layers. Such shift of the central wavelength is referred as a central wavelength shift or wavelength shift (Δλ). In other words, in an embodiment, a central wavelength shift refers to a difference between an ideal central wavelength (e.g., associated with 514/518'/516') and a shifted wavelength (e.g., associated with 518/516) of the reflected beams 426.

In an embodiment, the apodization caused due to the stack of layers 506, 508, and 510 is sensitive to the thickness of stack layers 506, 508, and 510. In other words, if the thickness of one or more layers 506/508/510 on top of the mark layer 502 changes, the apodization effect also changes. In an embodiment, the change in the thickness of the stack of layers 506, 508, and 510 may be caused due to process variation. For example, the process variation may be related to an etch process, a resist development process, or other processes of the patterning process. Such change in thickness of the layers cannot be predicted (e.g., via calibrated process models) accurately enough due to, for example, random or stochastic variations of a process. Hence, a change in the apodization may not be accurately predicted.

Furthermore, in an embodiment, the change in a layer thickness may cause the diffraction orders of the reflected beams 426 to move at a different location (e.g., shift right or left) on the objective lens 424 when passing through the objective lens 424. Such movement or displacement of the diffraction orders at the objective lens 424 can also related to the angular reflectance.

In addition to the apodization problem, the reflected beams 426 may collect phase errors because of aberrations of the optical system (e.g., the objective lens 424). For example, aberrations may be because the objective lens 424 is not perfect. Such phase errors also contribute to shift in the intensity distribution 516/518 of the reflected beams 426. Furthermore, as the thickness of the stack layers may cause the diffraction orders to move on the objective lens 424, thereby collecting different phase errors.

Thus, the reflected beams 426 carry information related to at least two types of error: (i) errors due to thickness of the layers formed on top of the metrology mark (e.g., alignment mark 402); and (ii) phase errors due to aberrations. Furthermore, there are interactions between these types of error. Such errors cannot be isolated from the reflection beams 426, for example, based on the intensity distributions 516/518.

In addition, the thickness of the stack of layers 506, 508, and 510 cannot be predicted accurately. Therefore, it is very difficult to distinguish the errors (e.g., phase errors or alignment errors) from the unpredictable change of the thickness of the stack of layers 506, 508, and 510 when the peak intensities of the reflected beams 516 and 518 move. In order to solve these problems, metrology marks are configured to include a sub-segmented grating, such that the sub-segment dimensions are particular determined to, for example, minimize (or maximize) an effect of process variation (e.g., variation in layer thickness).

As discussed in the methods herein, a grating structure of the metrology marks can be determined based on the purpose of measurement. For example, a pitch, a duty cycle, and/or CD of sub-segments forming the grating structure are determined based on minimization of position errors, or overlay errors. Thus, based on the purpose of measurements, the resulting a metrology mark may be referred as an alignment mark or an overlay mark.

In an embodiment, the substrate 502 is located at the bottom of wafer W. The substrate 502 may be made of one or more materials (e.g., silicon, silicon oxide, silicon on insulator (SOI), etc.). On the substrate 502, the mark layer 504 including the metrology mark with a grating structure to be described herein is formed. The mark layer 504 is made of one or more materials (e.g., silicon, silicon oxide, silicon nitride, etc.). Further, the stack of layers 506, 508 and 510 is formed on top of the mark layer 504. Each layer of the stack of the layers 506, 508, 510 (or referred to as a "layer stack") may be made of one or more materials (e.g., silicon, silicon oxide, silicon nitride, etc.). The present disclosure is not limited to a number of layers in the stack of layers. The three layers 506, 508, 510 are shown as an example layer stack, but is not limiting. In an embodiment, more or fewer layers than 3 layers can be formed on top of the alignment mark layer 504.

The objective lens 424 (e.g., lens, lens elements, etc.) may be any one or a combination of various types of optical components, including refractive, reflective, magnetic, electromagnetic, and electrostatic optical components. In some examples, the optical component 424 is made from a radiation transmissive substance (e.g., glass, epoxy, quartz, etc.) for concentrating or dispersing light rays. In one embodiment, the objective lens 424 may be used to concentrate and/or focus and an incoming radiation 514 from a light source (e.g., a laser, etc.).

In one embodiment, the metrology mark on the mark layer 504 has a grating structure that includes a plurality of mark segments (e.g., a vertical sub-segmented grating or a horizontal sub-segmented grating). In an embodiment, one or more of the mark segments may include a plurality of subsegments, as will be described with respect to FIGS. 6A, 6B, 6C, and 7A. The sub-segmented grating can be characterized by one or more variables (e.g., a pitch, duty cycle, line width and/or combination thereof). In an embodiment, values of these one or more variables are determined based on a characteristic function, described herein.

The characteristic function can be a function of an angular reflectance and/or a wavelength shift ($\Delta\lambda$) of the reflected beam, and thickness of one or more layers of a stack layer. In an embodiment, the characteristic function comprises a change in a wavelength of a reflected beam with respect to the wavelength of an incident radiation as a function of a change in thickness of the stack, the reflected beam being a beam reflected from the metrology mark and passing through the stack. In an embodiment, the characteristic function comprises a change in the angular reflectance of the reflected beam as a function of a change in thickness of the stack, the reflected beam being a beam reflected from the metrology mark and passing through the stack.

The wavelength shift ($\Delta\lambda$) is an amount of change in the central wavelength of the reflected beam with respect to the wavelength of the incident beam. The characteristic function can be optimized according to a purpose of measurement. For example, the characteristic function may be minimized or maximized for measurement of a physical characteristic (e.g., location of the metrology mark, stack layer thickness, etc.) associated with a substrate. For example, minimizing a wavelength shift ($\Delta\lambda$) of the reflected beam results in an accurate measurement of a location of the metrology mark. In another embodiment, maximizing the change in the wavelength of the reflected beam results in an accurate measurement of a layer thickness or a stack layer thickness.

Figure 6A:
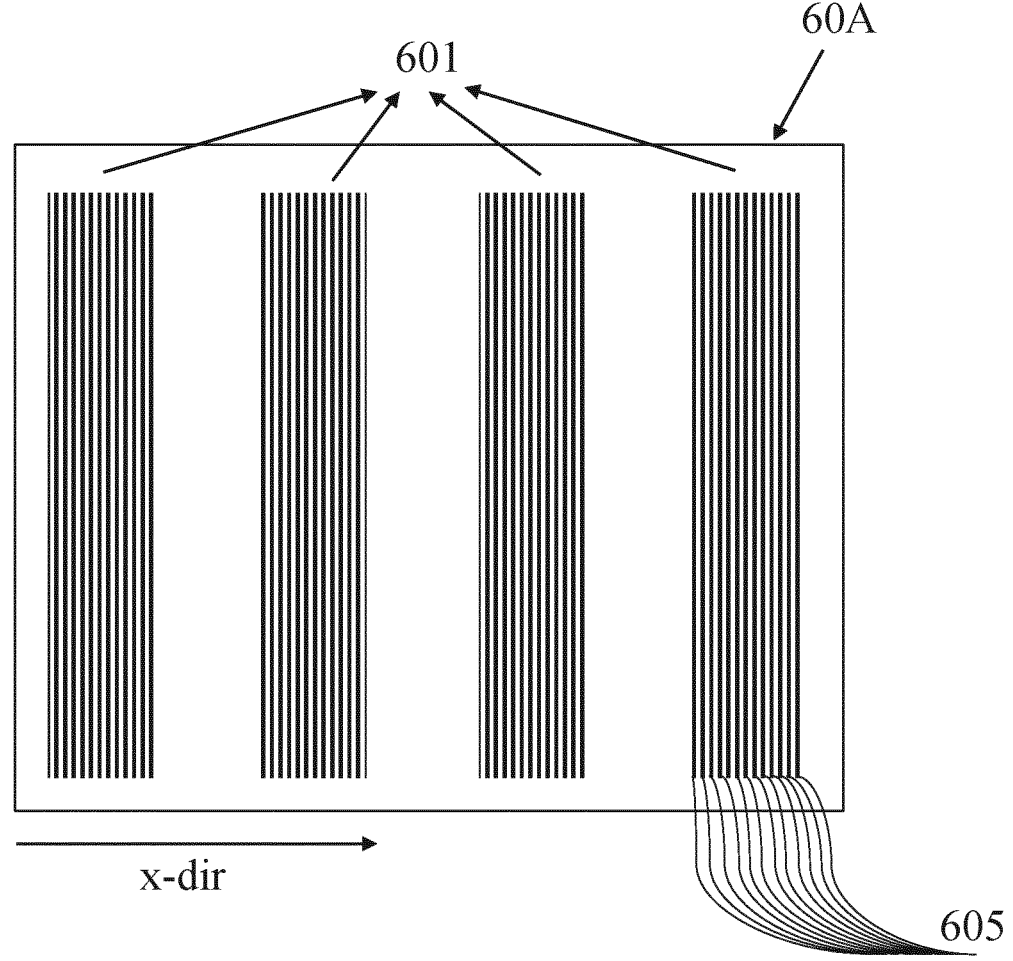
FIG. 6A illustrates a design of a vertical sub-segmented grating structure for the metrology mark, according to an embodiment.
Figure 6B:
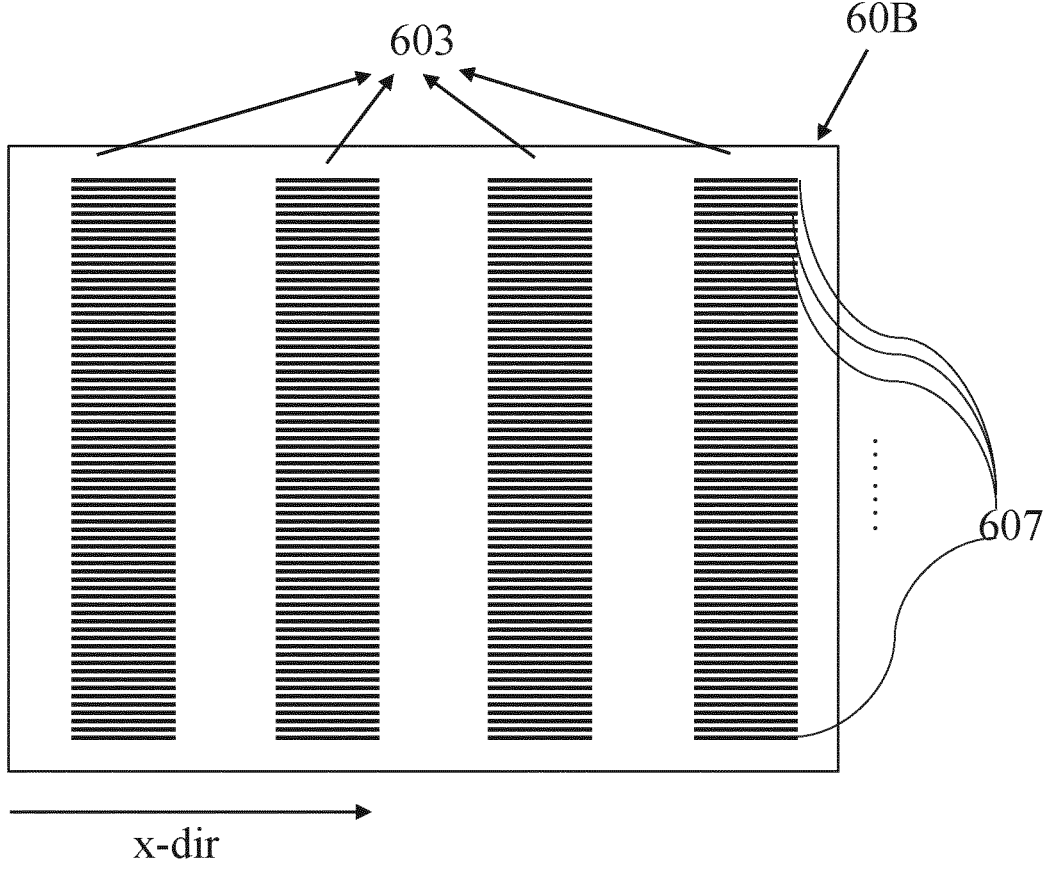
FIG. 6B illustrates a design of a horizontal sub-segmented grating structure for the metrology mark, according to an embodiment.

FIGS. 6A and 6B illustrate an example metrology mark e.g., alignment marks configured for position measurements according to an embodiment of the present disclosure. In an embodiment, the metrology mark (e.g., overlay marks) may be configured for overlay measurements according to an embodiment of the present disclosure.

In FIG. 6A, an example first metrology mark 60A (e.g., an alignment mark) includes mark segments 601. This first metrology mark 60A is also referred a vertically sub-segmented grating. FIG. 6B illustrates an example second metrology mark 60B including mark segments 603. This second metrology mark 60B is also referred as a horizontally sub-segmented grating. In FIGS. 6A and 6B, each of the mark segments 601 and 603 are sub-segmented. In particular, the mark segments 601 are vertically sub-segmented, wherein the mark segments 601 are sub-segmented into sub-segments 605 that run perpendicular to a main grating direction (e.g., x-direction in FIG. 6A). On the other hand, mark segments 603 are horizontally sub-segmented, wherein the mark segments 603 are sub-segmented into sub-segments 607 that run parallel to or along the main grating direction (e.g., x-direction in FIG. 6B). The mark segments 601 and 603, shown as parallel lines, are examples and does not limit the scope of the present disclosure. It can be understood by a person skilled in the art that the scope of the present disclosure is not limited to a particular orientation or geometric shape of the mark segments. In some embodiments, subsegments can be dashed lines, rectangular lines, triangles, etc.

The first metrology mark 60A in FIG. 6A may be characterized by one or more variables (also referred a physical characteristics) related to the vertical sub-segments 605. The one or more variables may be a pitch, a line width, or a duty cycle of the vertical sub-segmented grating structure. The pitch of the vertical sub-segments may be a grating period of the subsegments 605, which is the spacing between each vertical subsegment in the vertical sub-segmented grating. The pitch of subsegments 605 can be set to a desired value, in accordance with the embodiment. For example, a metrology mark (e.g., an alignment mark) containing a periodic structure (e.g., a grating) includes subsegments with a pitch or a period of 500 nm, where a center to center spacing of adjacent subsegments is 500 nm.

Alternatively or in addition, the first metrology mark 60A may be characterized by a line width of the vertical subsegments in the vertical sub-segmented grating. For example, the line widths of the subsegments 605 can be set to a desired value. In one embodiment, for example, the line width of the subsegments 605 can be 50 nm. Alternatively or in addition, the first metrology mark 60A may be characterized by a duty cycle of the vertical sub-segmented grating. The duty cycle of the vertical sub-segmented grating is the line width of the subsegments 605 divided by the pitch or the period of the subsegments 605. For example, a vertical sub-segmented grating with a line width of 50 nm and a pitch of 500 nm may have a duty cycle of 0.1.

Similarly, the second metrology mark 60B shown in FIG. 6B, may be characterized by one or more variables related to the horizontal sub-segments 607. The one or more variables may be a pitch, a line width, or a duty cycle of the horizontal sub-segmented grating structure. The pitch of the horizontal sub-segments 607 may be a grating period of the horizontal sub-segments 607, which is the spacing between each subsegment in each group of sub-segments of gratings in the horizontal sub-segmented grating. The pitch of subsegments 607 can be set to a desired value, in accordance with the embodiment. For example, the second metrology mark 60B including a periodic structure (e.g., a grating) may have subsegments with a pitch or a period of 500 nm may have a center-to-center spacing of adjacent subsegments in each group of horizontal sub-segmented grating to be 500 nm.

Alternatively or in an addition, the second metrology mark 60B may be characterized by a line width of the horizontal subsegments in the horizontal sub-segmented grating. For example, the line widths of the subsegments 607 can be set to a desired value. In one embodiment, for example, the line width of the subsegments 607 can be 50 nm. Alternatively or in an addition, the second metrology mark 60B may be characterized by a duty cycle of the horizontal sub-segmented grating. The duty cycle of the horizontal sub-segmented grating is the line width of the subsegments 607 divided by the pitch or the period of the subsegments 607. For example, a horizontal sub-segmented grating with a line width of 50 nm and a pitch of 500 nm may have a duty cycle of 0.1. Although the above examples show same characteristics for both vertical and horizontally subsegmented grating, it can be understood that the characteristic (e.g., a pitch, a duty cycle, CD) of the horizontal sub-segments 607 can be different from the vertical subsegments 605. In an embodiment, a combination of vertical and horizontal subsegments having the same or different characteristics (e.g. a pitch, a duty cycle, CD) may be used in one metrology mark.

Figure 6C:
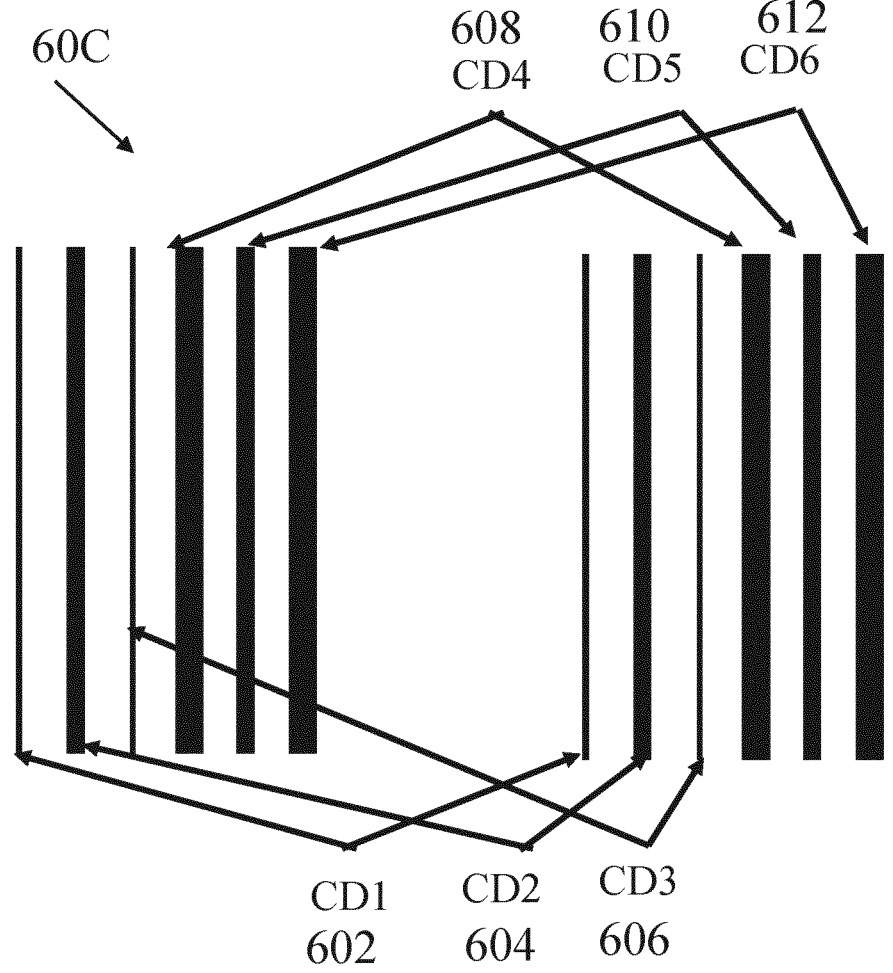
FIG. 6C illustrates an example design of a sub-segmented grating structure with a constant pitch and different line widths of the sub-segmented grating structure for the metrology mark, according to an embodiment.

FIG. 6C illustrates another example of a metrology mark 60C. The metrology mark 60C includes a sub-segmented grating structure having a constant pitch and six different line widths. In an embodiment, the sub-segmented grating structure is configured for use as the alignment mark. For example, the metrology mark 60C includes subsegments 602, 604, 606, 608, 610, and 612. Each of the subsegments 602, 604, 606, 608, 610, and 612 has different line widths (e.g., CD1, CD2, CD3, CD4, CD5, and CD6, respectively.) Each of the subsegments 602, 604, 606, 608, 610, and 612 may be repeated with the constant pitch in the alignment mark.

In an embodiment, the metrology mark may be optimized by perturbing one or more variables (e.g., pitch, line width, duty cycle, etc.) of a sub-segmented grating structure and analyzing effects of such perturbation on, for example, the angular reflectance and/or a central wavelength shift ($\Delta\lambda$) of the reflected beam. For example, the optimization includes minimizing a change of the angular reflectance of a reflected beam and/or minimizing a central wavelength shift ($\Delta\lambda$) of the reflected beams (e.g., 516 and 518 in FIG. 5). For example, the sub-segmented grating structure in FIG. 6C has a constant pitch, and after perturbations of line widths of the subsegments, represented by "CD" or "critical dimension" (e.g., CD1, CD2, CD3, CD4, CD5, and CD6 in FIG. 6C), an optimized sub-segmented grating structure is generated.

The perturbation or the optimization may be a method of achieving the best or most effective use of a resource by repetitively modifying or changing one or more variables of the sub-segmented grating structure. For example, the perturbation or the optimization of CDs may be a method of repetitively modifying or changing one or more variables that may impact the reflected beams (e.g., 426 in FIG. 5). In an embodiment, such perturbation may be accomplished by use of simulation software (e.g., Finite-Difference Time-Domain method, rigorous coupled wave analysis (RCWA), etc.) to minimize the change of the angular reflectance of the reflected beams.

In some embodiments, a perturbation of one or more variables (e.g., pitch, line width, duty cycle, etc.) associated with the sub-segmented grating structure may be used to generate an optimized sub-segmented grating structure. In an embodiment, the optimized sub-segmented grating maximizes the change of the angular reflectance and/or the change in a wavelength of the reflected beams (e.g., 516 and 518 in FIG. 5). For example, in one example, the sub-segmented grating structure may have a constant pitch, and after a perturbation or optimization of line widths of the subsegments, represented by "CD" or "critical dimension" (e.g., CD1, CD2, CD3, CD4, CD5, and CD6 in FIG. 6C), an optimized sub-segmented grating structure may be generated.

Figure 7A:
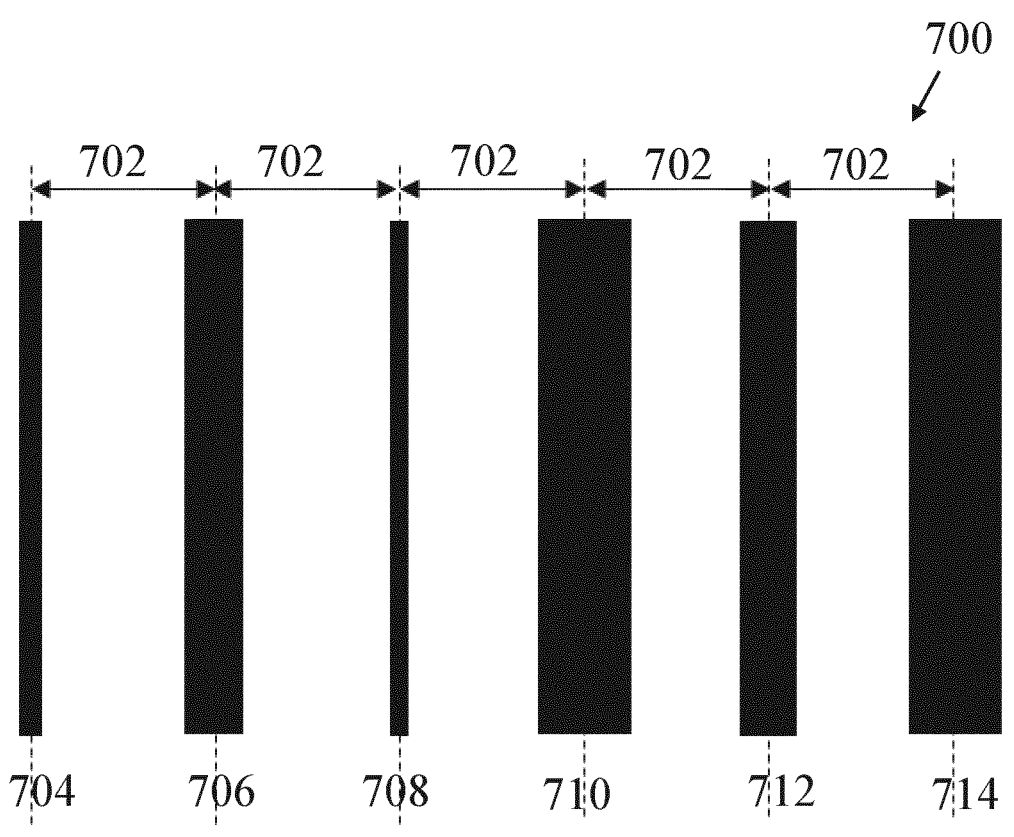
FIG. 7A illustrates another example design of a sub-segmented grating structure with a constant pitch and a variable line width of the sub-segmented grating structure for the metrology mark, according to an embodiment.

FIG. 7A illustrates an example of metrology mark 700 including a sub-segmented grating structure having a constant pitch and a variable line width of sub-segments, according to an embodiment. In an embodiment, the variation in the line width refers to CD variation with respect to a nominal CD (e.g., 20 nm) associated with the patterning process. In an embodiment, the line width may vary in a range ±1% to ±99% with respect to the nominal CD.

The sub-segmented grating structure in FIG. 7A has a constant pitch 702 and a variable line width between one or more subsegments. The pitch 702 of the sub-segmented grating structure may be a grating period, which is the spacing between adjacent subsegments in the sub-segmented grating. For example, the metrology mark 700 including a periodic sub-segmented grating structure may have a constant pitch of 500 nm, which is the center-to-center spacing 702 between adjacent subsegment lines, as shown. Specifically, in the embodiment shown, there is a center-to-center spacing 702 of 500 nm between the center of the subsegment 704 and the center of the subsegment 706. Similarly, there is a spacing 702 of 500 nm between the center of the subsegment 706 and the center of the subsegment 708. A spacing 702 of 500 nm, between the center of the subsegment 708 and the center of the subsegment 710. A spacing 702 of 500 nm, between the center of the subsegment 710 and the center of the subsegment 712. And a spacing 702 of 500 nm, between the center of the subsegment 712 and the center of the subsegment 714.

In an embodiment, one or more of the subsegments 704, 706, 708, 710, 712, and 714 have a different width than the other subsegments. In an embodiment shown in FIG. 7A, each of the subsegment have a different width than the other subsegments. By changing the grating structure, a frequency spectrum related to the light reflected from the grating structure will change. For example, the frequency spectrum can be determined (e.g., using Fourier transform) from the diffraction signal of the light reflected from the grating structure. In other words, the subsegments 704, 706, 708, 710, 712, and 714 are optimized by perturbing a combination of either line width, pitch variation, and/or duty cycle, so that a desired frequency spectrum response is obtained. For example, the subsegments have a variable pitch to desensitize the frequency spectrum from an impact of stack thickness variations. In an embodiment, the desensitization to stack thickness variations may be measured in terms of angular reflectance.

Figure 7B:
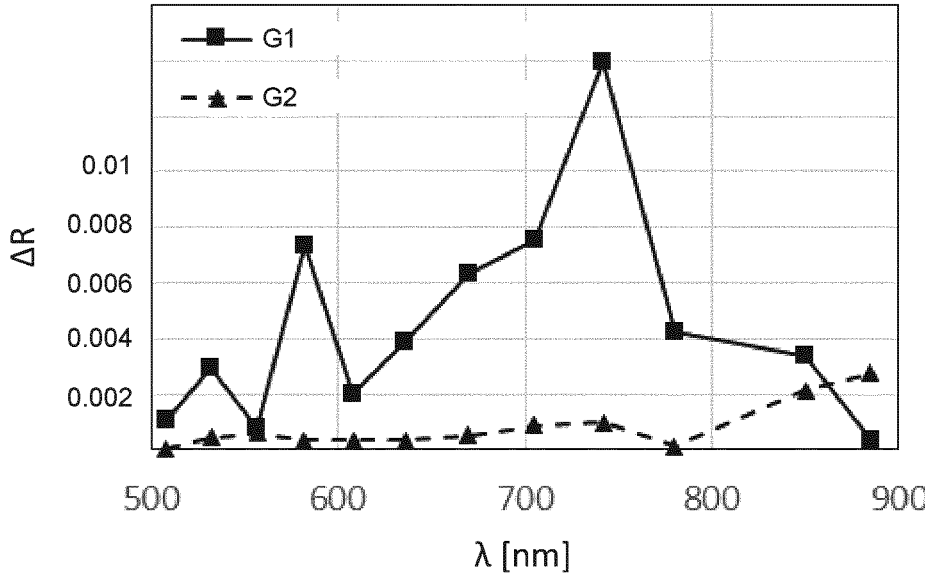
FIG. 7B illustrates a graph illustrating angular reflectance of the reflected beam plotted against radiation wavelength for two different sub-segmented grating structures.

FIG. 7B is a plot illustrating changes in the angular reflectance of the reflected beam reflected from two different metrology marks having grating structures G1 and G2, respectively. In an embodiment, the grating structure G1 may include conventional sub-segments or no sub-segments at all, while the grating structure G2 includes sub-segment structure optimized according to the present disclosure. The X axis in the plot represents a wavelength λ (e.g., ranges from 500 nm to 900 nm) of the incoming radiation illuminating the metrology mark (e.g., an alignment mark). The Y axis in the plot represents the angular reflectance of the reflected beam reflected from the grating structures G1 and G2 after interacting with the stack of layers (e.g., 506, 508, and 510 in FIG. 5).

As mentioned earlier, the change of the angular reflectance of the reflected beam may be caused due to the reflected beam interacting with the stack of layers (e.g., 506, 508, and 510). The variation of the thickness and/or material of the stack of layers (e.g., 506, 508, and 510) causes a re-weighting of spectral content (e.g., power spectral density) of the diffraction orders or the change of the angular reflectance of the reflected beam. For example, the re-weighting of the spectral content can be represented by power spectral density (PSD) that describes the distribution of power over frequency and may be computed using the Fourier transform of the diffraction signal from the sub-segmented grating structure. Understanding where in the frequency spectrum the power is transferred can help understand which subsegments to be optimized.

However, typically, the alignment sensor AS is calibrated independent of variations in thickness of stack of layers (e.g., 506, 508, and 510). In other words, the sensor calibration does not consider effects related to a displacement of diffraction orders in a pupil plane of the sensor. For example, the calibration can be before or after depositing stack layers on the mark layer (e.g., 504) containing the metrology mark (e.g., alignment mark). However, the calibration may not accurately take into account the change of the angular reflectance, the change of the central wavelength because of the process variation (e.g., thickness variation, material variation, etc.), or a displacement of the diffraction orders in a pupil plane. Hence, measurements obtained from a sensor, e.g., the alignment sensor AS include measurement errors such as position errors associated with alignment mark, where the position errors result from process variation.

According to the present disclosure, the aforementioned effects caused due to the interaction with the stack of layers 506, 508, and 510 may be optimized (e.g., minimized or maximized). For example, the optimization may be performed by repetitively perturbing the physical characteristics (e.g., duty cycle, pitch, and line width) of the sub-segmented grating structure.

Referring to FIG. 7B, the metrology mark including the grating structure G1 (e.g., having no sub-segments) causes a significant change in the angular reflectance over a wide range of wavelengths. In the present example, a spike in the angular reflectance is observed at about 740 nm. The spike indicates that even a small change in wavelength (e.g., due to process variation) can significantly affect the angular reflectance of the reflected beams. The grating structure G1 was generated without perturbing the variables (e.g., duty cycle, pitch, and line width) of the sub-segmented grating structure, thus causing relatively larger change of angular content (e.g., angular reflectance) of the reflected beams.

On the other hand, the metrology mark including the grating structure G2, in FIG. 7B, has been generated by perturbing and optimizing the physical characteristics (e.g., duty cycle, pitch, and line width) of the sub-segments of the grating structure G2. For example, the physical characteristics of the grating structure G2 are optimized to minimize the change of the angular reflectance of the reflected beams. In other words, the (sub-segmented) grating structure G2 has less or minimum dependency on the wavelength of the light source and/or the process variations. Therefore, the metrology mark including the grating structure G2 displays minimal change in the angular reflectance of the reflected beam over a range of wavelengths. Hence, the metrology mark will show measurement robustness against the process variations. In other words, although the process variation may cause a change in layer thickness or a change in the central wavelength of the reflected beam, the angular reflectance remains substantially constant. This indicates errors due to process variations are fairly constant in the reflected beam. Hence, the reflected beam provides information to accurately determine position or overlay measurements compared to existing metrology marks (e.g., having constant CD, pitch and duty cycle).

In an embodiment, as mentioned earlier, the metrology mark may be determined based on the change in a wavelength of the reflected beam. The change in a wavelength of the reflected beam caused due to the interaction with the stack of layers (e.g., 506, 508, and 510) may be minimized by iteratively perturbing or changing thickness of each of the individual stack layers (e.g., 506, 508, 510, etc.). Hence, the resulting metrology mark will be less sensitivity to variations in thickness of the one or more layers of the stack layers. For example, such metrology mark may be used for position measurement.

In some embodiments, the change in a wavelength of the reflected beam caused due to the interaction with the stack of layers 506, 508, and 510 may be maximized by iteratively perturbing or changing thickness of each of the individual stack layers (e.g., 506, 508, 510, etc.). Thus, the resulting metrology mark will be highly sensitivity to variations in the thickness of the one or more layers of the stack layers. For example, such metrology mark may be used for measuring thickness of the stack layer(s).

The variation in the thickness (and/or material) of the stack of layers (e.g., 506, 508, and 510) changes the spectral content (e.g., PSD) of the reflected beam. In the examples above, the angular reflectance and the change in a wavelength of the reflected beam are examples of the spectral content of the reflected beam. However, the scope of the present disclosure is not limited such spectral content and additional spectral content may be determined, e.g., using spectral analysis, and further used to optimize subsegments of the grating structure.

Figure 8:
FIG. 8 illustrates yet another design of a sub-segmented grating structure with a constant pitch and variable duty cycles of the sub-segmented grating structure for the metrology mark, according to an embodiment.
Figure 8:
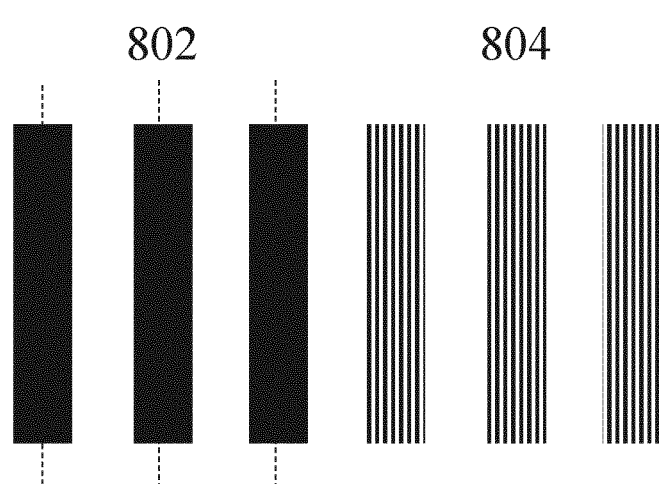

FIG. 8 illustrates another example of a metrology mark 800. The metrology mark includes a sub-segmented grating structure (e.g., 802 and 804) having a constant pitch and variable duty cycles, according to an embodiment. As discussed herein, a perturbation of variables (e.g., a duty cycle) of the sub-segmented grating structure may be used to generate an optimized sub-segmented grating structure. The optimization involves e.g., minimization or maximization of the change of the angular reflectance and/or the change in a wavelength of the reflected beam.

For example, the sub-segmented grating structure, in FIG. 8, is set at a constant pitch and a duty cycle between a group of subsegments 802 and a group of subsegments 804 is perturbed so that an optimized (e.g., minimum change in the reflectance) sub-segments of the grating structure is generated.

Figure 9:
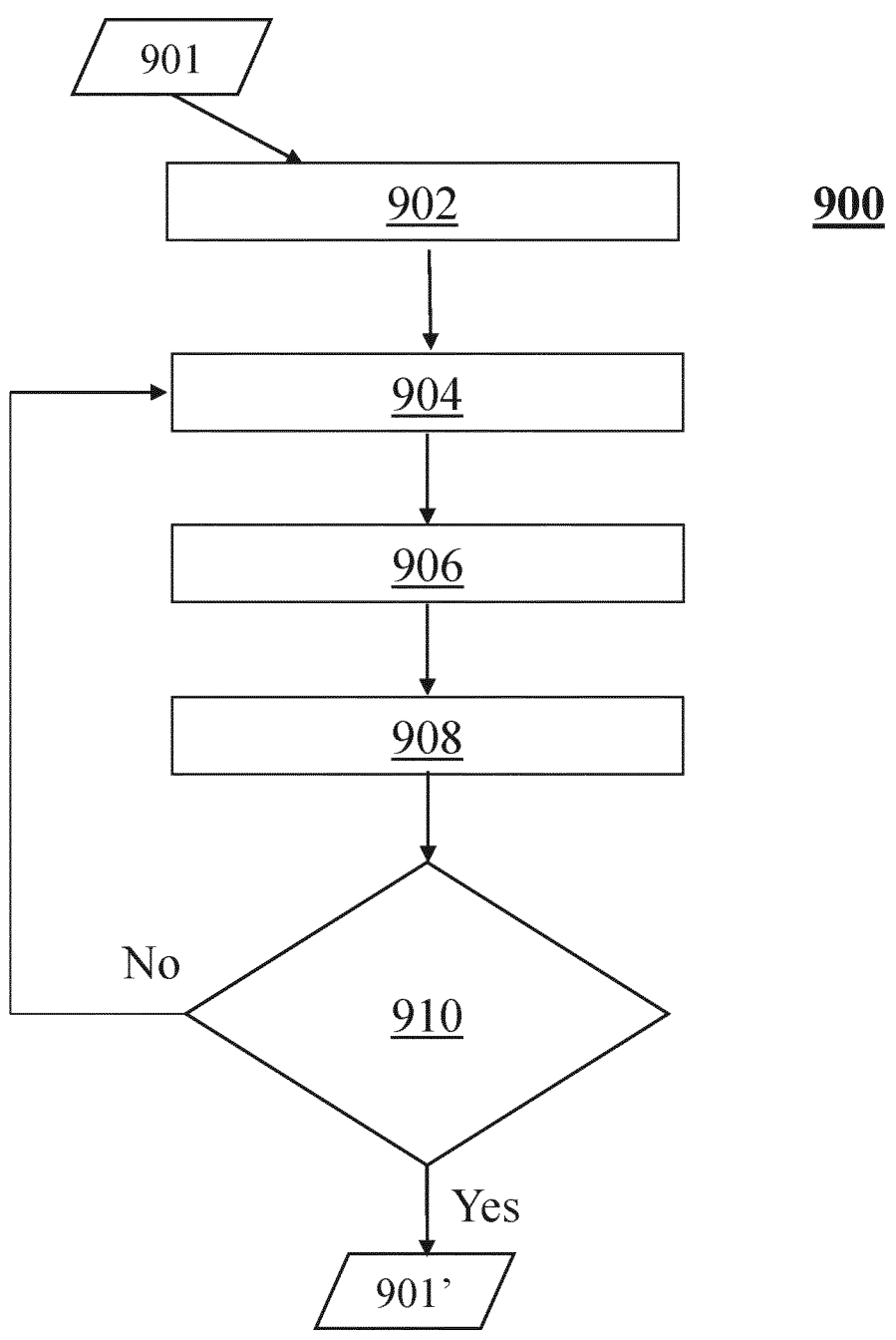
FIG. 9 illustrates a flowchart of an exemplary method of calculating a characteristic function by perturbing variables for the sub-segmented grating structure for the metrology mark, according to an embodiment.

FIG. 9 illustrates a flowchart of an example method 900 for determining a metrology mark (e.g., an alignment mark). The method 900 involves calculating a characteristic function by perturbing variables of subsegments of a grating structure, according to an embodiment. The concepts of the method 900 are discussed with respect to alignment mark as an example. However, the method 900 can be used to generate metrology marks other than for alignment purposes. For example, the method 900 can also be used for generating metrology marks for overlay measurement purposes or measuring thickness of a stack layer.

The method 900 includes optimizing subsegments of the grating structure for a purpose of measurement e.g., alignment. In an embodiment, the optimized sub-segmented grating structure provides an improved measurement of a location of the alignment mark on a substrate during the patterning process or an overlay between different layers on the substrate. Further, the determined location or the overlay measurements can be used to improve a performance metric (e.g., overlays, critical dimension (CD), edge placement errors (EPE), yield, etc.) of a patterning process. For example, in a semiconductor manufacturing process, hundreds of process steps may be performed to manufacture a device (e.g., a processor, etc.). The improved measurement of the location of the alignment mark at each process step of the semiconductor manufacturing process can improve the printing performance of the patterning process. For example, a placement accuracy between a pattern on a mask and an existing pattern on a substrate, or between patterns on different layer of the substrate. In another example, an improved measurement of overlay can also improve the overlay error between patterns on different layers of the substrate.

In an embodiment, a change of the angular reflectance of the beam reflected off the alignment mark can be reduced by designing the sub-segmented grating structure accordingly. In another embodiment, the change in a wavelength of the beam reflected off the alignment mark can be reduced by designing the sub-segmented grating structure accordingly. The designed alignment mark can be further used to improve the yield of the patterning process.

The method 900 includes, at step 902, determining an initial characteristic function of an initial metrology mark 901 disposed within a layer stack on a substrate. In an embodiment, the characteristic function comprises a change in a wavelength of a reflected beam with respect to the wavelength of an incident radiation as a function of a change in thickness of the stack, the reflected beam being a beam reflected from the metrology mark (e.g., 901) and passing through the stack. In an embodiment, the characteristic function comprises a change in the angular reflectance of the reflected beam as a function of a change in thickness of the stack, the reflected beam being a beam reflected from the metrology mark (e.g., 901) and passing through the stack.

The initial metrology mark 901 includes a plurality of mark segments, wherein at least one of the mark segments includes a plurality of subsegments. In an embodiment, the mark segments may be obtained as discussed in the FIGS. 6A, 6B, 6C, 7A, and 8.

In one example, the initial metrology mark 901 include a sub-segmented grating structure having a constant pitch between subsegments and different line widths of subsegments. For example, the grating structure in FIG. 6C has a constant pitch and six different line widths. In an embodiment, the mark segments may have a vertical sub-segmented grating structure as shown in FIG. 6A, or a horizontal sub-segmented grating structure as shown in FIG. 6B.

The method 900 includes, at step 904, perturbing one or more variables of the plurality of subsegments of the initial metrology mark 901. In an embodiment, the one or more variables include a pitch, a duty cycle, a line width of the plurality of subsegments, or a combination thereof. Examples of perturbing the variables such as a duty cycle, a pitch, or a line width of the subsegment, or a combination thereof are discussed earlier with respect to FIGS. 5, 7A, and 7B. For example, the pitch and duty cycle of the plurality of subsegments may be constant, and the line width of the plurality of subsegments may be varied; the pitch and line width may be constant and the duty cycle of the plurality of subsegments may be varied; and/or the line width and duty cycle may be constant, and the pitch of the plurality of subsegments may be varied.

The method 900 includes, at step 906, perturbing a thickness of one or more layers within the layer stack, wherein the layer stack includes the initial metrology mark 901. In an embodiment, a thickness of each layer within the layer stack (e.g., layers 506, 508, 510, etc. in FIG. 5) are perturbed at least once. In one embodiment, the thickness of each layer is perturbed or altered multiple times.

In an embodiment, the thickness of the one or more layers of the layer stack may be randomly perturbed but keeping the perturbed thickness within a predetermined thickness range. In an embodiment, the total thickness of the stack layer (e.g., the combined thickness of layers 506, 508, 510, etc.) remains the same for each perturbation, while the thickness of two or more layers is perturbed. In an embodiment, the total (combined) thickness of the layer stack (e.g., 506, 508, 510, etc.) may change during perturbing the thicknesses of the layer stack.

In an embodiment, a random perturbation of thicknesses may be based on a pre-existing model (e.g., Gaussian model, resist model, or other related process models) stored in a memory (e.g., of a computer system). In one embodiment, the combination of one or more layers may include a nominal stack of layers, and thickness of each layer of the nominal stack of layers is perturbed in the step 906. In an embodiment, anywhere between 50 to 150 perturbations in the thickness of the one or more layers of the layer stack may be performed. In another embodiment, approximately 100 perturbations are performed.

It should be noted that, in another embodiment, the perturbation step of 906 may precede that of 904. In another embodiment, the steps 904 and 906 can be done simultaneously. In one embodiment, the perturbations of 904 and of 906 are done automatically be modelling. In another embodiment, each perturbation is performed manually by changing the variables at 904 and/or thicknesses at 906 one at a time for a predetermined number of iterations.

Further, the method 900 includes, at step 908, determining an updated characteristic function based on the perturbations of the one or more variables of the plurality of subsegments in the step 904 and/or the perturbations of the thickness of the one or more layers within the layer stack in the step 906.

In one embodiment, the characteristic function can be an amount of change in a wavelength of a reflected beam caused due to change in thickness of a layer of the layer stack. In an embodiment, an incident beam is reflected off the initial metrology mark 901 (or a modified metrology mark 901) and the reflected beam interacts with the thickness of the layer stack. The reflected beam can be further analyzed, e.g., using spectral analysis to determine the wavelength shift.

In an embodiment, after the perturbation of one or more variables of the initial metrology mark 901, the characteristic function (e.g., a wavelength shift) may decrease. In an embodiment, the characteristic function reaching a minimal value may be the characteristic function having a lowest value of a variation of the change in a wavelength of the reflected radiation. In an embodiment, after several perturbations of one or more variables (e.g., duty cycle, pitch, and line width) of the sub-segmented grating structure and/or the thickness of the layer stacks, a minimum value of the characteristic function may be obtained. Then, the subsegments having the perturbed variable values (e.g., duty cycle, pitch and line width) are considered optimized and the corresponding metrology mark including the optimized subsegments is considered an optimized metrology mark.

In an embodiment, the determination of the updated characteristic functions may be based upon the measured angular reflectance of radiation, as discussed earlier with respect to FIGS. 6A, 6B, 7A, 7B and 8.

The method 900, at step 910 may determine whether a minimized characteristic function is reached. In an embodiment, the minimized characteristic function may be reached after a specific number of iterations of steps 904 through 910. In an embodiment, the characteristic function is determined as optimized when the characteristic function breaches a predetermined low threshold value of the characteristic function.

In one embodiment, if the characteristic function at step 910 is not minimized (or the lower threshold is not breached), then the process returns to the step 904 for further perturbation of the variables (e.g., duty cycle, pitch, and line width) of the sub-segmented grating structure of the metrology mark 901. For example, a first perturbation may be the pitch and the duty cycle of the plurality of subsegments are maintained constant, and the line width of the plurality of subsegments is varied. A second perturbation may be the pitch and the line width are maintained constant, and the duty cycle of the plurality of subsegments is varied. A third perturbation may be the line width and the duty cycle are maintained constant, and the pitch of the plurality of subsegments is varied.

In an embodiment, a further perturbation of the thickness of the stack of layers may be performed at the step 906, as discussed earlier. The perturbations may be performed randomly, by an algorithm and/or a program that perturbs the thickness in a pre-determined sequence and within a predetermined thickness range, by a machine learning model, or a combination thereof. In an embodiment, if the characteristic function representing the variation of the change in a wavelength of the reflected beam reaches a minimal cost value, then the thickness of the stack of layers is considered as optimized.

Responsive to the characteristic function being minimized or reaching the threshold value, an optimized metrology mark 901' is realized. For example, the metrology mark 901' includes optimized sub-segmented grating after the perturbation of variables (e.g., optimized duty cycle, pitch, and/or line width). This will be a finalized grating and in particular, the sub-segmented configuration thereof, that will provide reduced change in the central wavelength and/or reduced angular reflectance of a reflected beam in comparison with a conventional grating or the initial grating 901. The metrology mark 901' thereby provides measurement robustness and is less sensitive to process variation as discussed above.

In one embodiment, the minimized characteristic function is determined based upon optimized critical dimension (e.g., thicknesses) of the subsegments within the metrology mark. Thus, an optimized metrology mark is determined to be formed at step 912 when the line thicknesses of the subsegments within the metrology mark achieve a reduced or optimized characteristic function at step 910. The optimized sub-segmented grating structure is thus created with this optimized variable (e.g., line width as the working example.) to generate a minimal change of the angular reflectance of the beam reflected off the metrology mark, and a minimal change in a wavelength of the beam reflected off the metrology mark can be achieved for a large range of stack thickness variations. Therefore, the optimized sub-segmented grating structure provides an improved measurement of determining a location of the metrology mark on a substrate during the patterning process so that a performance metric (e.g., overlays, critical dimension (CD), edge placement errors (EPE), yield, etc.) is improved.

In an embodiment, the method 900 can be applied to determine overlay measurements. An example determination of the overlay measurements based on optimized sub-segmented grating structure is explained with respect to FIG. 10A.

Figure 10A:
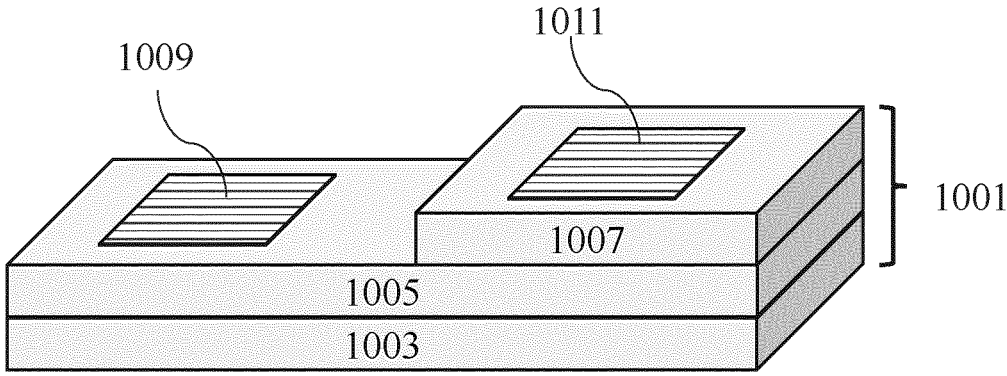
FIG. 10A illustrates an exemplary stack of layers including optimized sub-segmented grating structures determined according to the method of FIG. 9, according to an embodiment.

FIG. 10A illustrates an exemplary stack of layers including optimized sub-segmented grating structures determined according to the method 900.

In FIG. 10A, a stack of layer 1001 comprises a first layer 1003 formed on top of the second layer 1005. The first layer 1003 may be a substrate layer, e.g., a silicon layer, a silicon dioxide layer, or a silicon on insulator layer (SOI) layer. The second layer 1005 may be a product layer. For example, a product layer may be made by one or more materials, e.g., silicon, silicon dioxide, silicon nitride, or a combination thereof. In an embodiment, a third layer 1007 may be formed on at least a portion of the second layer 1005. The third layer 1007 may be a resist layer, which may be patterned via the lithographic apparatus in FIG. 1.

In an embodiment, for overlay measurements between different layers, a first optimized sub-segmented grating structure 1009 may be formed on at least a portion of the second layer 1005, and a second optimized sub-segmented grating structure 1011 may be formed on at least a portion of the third layer 1007. As mentioned earlier, the optimized sub-segmented grating structure 1009 and/or 1011 have sub-segments that minimizes change of the angular reflectance of the beam reflected off the grating structure. In an embodiment, the grating structures 1009 and/or 1011 cause a minimal change in a wavelength of the beam reflected off the grating structure.

After patterning the optimized sub-segmented grating structures 1009 and 1011 are on the layers 1005 and 1007, respectively, a metrology tool may be used to obtain diffraction signals from the grating structures 1009 and 1011. The diffraction signals are further used to determine an overlay measurement between the two grating structures 1009 and 1011 or the overlay between the respective layers 1005 and 1007 on which the grating structures are formed. The determination of the overlay measurement is further discussed in detail with respect to FIG. 10B.

Figure 10B:
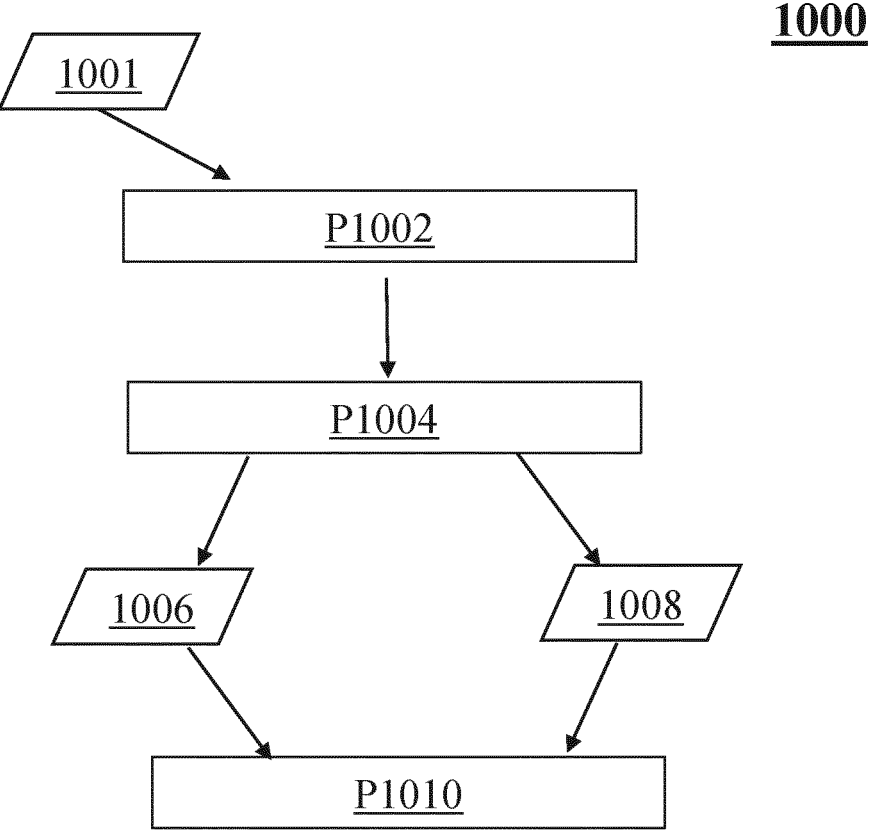
FIG. 10B illustrates an exemplary method of determining an overlay measurement using the optimized sub-segmented grating structure, according to an embodiment.

FIG. 10B illustrates an exemplary method of determining an overlay measurement using the optimized sub-segmented grating structure, according to an embodiment.

The method 1000 is used for determining an overlay measurement by using optimized sub-segmented grating structures (e.g., 1009 and 1011). In an embodiment, the optimized sub-segmented grating structures (e.g., 1009 and 1011) are developed to provide an improved measurement e.g., an overlay measurement. The improved overlay measurements can be further used to improve a performance metric (e.g., a function of an overlay, critical dimension (CD), edge placement errors (EPE), yield, etc.) associated with the patterning process.

The method 1000 includes, at step P1002, obtaining a substrate comprising a stack of layers (e.g., the stack of layers 1001 in FIG. 10A). In an embodiment, the stack of layers (e.g., the stack of layers 1001) includes at least one optimized sub-segmented grating structures (e.g., 1009 or 1011 in FIG. 10A). For example, the optimized sub-segmented grating structure (e.g., 1009) may be disposed on the first layer of the substrate (e.g., layer 1007) and another (optimized) sub-segmented grating structure (e.g., 1011) may be disposed on the second layer of the substrate (e.g., layer 1005). In one example, the stack of layer 1001 may include a sub-segmented grating structure with a constant pitch and six different line widths, as discussed with respect to FIG. 6C.

Further, the method 1000 includes, at step P1004, obtaining diffraction signals 1006, via a metrology tool, associated with the optimized sub-segmented grating structures on the stack of layers 1001. The metrology tool may be similar to the metrology apparatus as previously discussed in FIG. 3A, which describes a measurement apparatus for use in measuring targets according to an embodiment using a pair of illumination apertures providing certain illumination modes. In the embodiment, the metrology apparatus suitable to measure, e.g., overlay is also schematically shown in FIG. 3A.

For example, in FIG. 3A a target T comprising the grating structure (e.g., 1009 or 1011) and diffracted rays from the target T can be used as diffraction signals 1006. In an embodiment, the diffraction signal 1006 is detected by the detector 19, where the signal 1006 is associated with the optimized sub-segmented grating structure (e.g., 1009). Another signal 1008 may be detected by the detector 19, where the signal 1008 is associated with another (optimized) sub-segmented grating structure (e.g., 1011).

The method 1000 further includes step P1010 for determining an overlay measurement based on the first signal 1006 and the second signal 1008. In an embodiment, a processor, or a computer system, may determine the information from the signals 1006 and 1008. The information may be associated with a distance between the optimized sub-segmented grating structure (e.g., 1009 in FIG. 10A) on the first layer (e.g., 1005 in FIG. 10A) and another (optimized) sub-segmented grating structure (e.g., 1011 in FIG. 10A) on another layer (e.g., 1007 in FIG. 10A). The information may be associated with the pitch of the optimized sub-segmented grating structures (e.g., 1009 and 1011), and the linewidth of the optimized sub-segmented grating structures (e.g., 1009 and 1011).

In an embodiment, the overlay may be determined based on an interference pattern of the signals 1006 and 1008. For example, the interference pattern of the signals 1006 and 1008 may be dependent on the distance between the optimized sub-segmented grating structures (e.g., 1009 and 1011). While specific embodiments of the disclosure have been described above, it will be appreciated that the disclosure may be practiced otherwise than as described. While the example structures described above as metrology marks are grating structures specifically designed and formed for the purposes of position measurement, in other embodiments, positions may be measured on structures which are functional parts of devices formed on the substrate.

Many devices have regular, grating-like structures. The terms "mark" and "grating structure" as used herein do not require that the structure be provided specifically for the measurement being performed. An opaque layer is not the only kind of overlying structure that may disrupt measurement of the position of the mark by observing the mark in conventional wavelengths. For example, surface roughness, or a conflicting periodic structure, may interfere with measurement at one or more wavelengths.

In association with the position-measuring hardware and suitable structures realized on substrates and patterning devices, an embodiment may include a computer program containing one or more sequences of machine-readable instructions implementing methods of measurement of the type illustrated above to obtain information about the position of the mark covered by an overlying structure.

This computer program may be executed, for example, by a processor or the like which is dedicated to that purpose. There may also be provided a data storage medium (e.g., semiconductor memory, magnetic or optical disk) having such a computer program stored therein.

Although specific reference may have been made above to the use of embodiments of the disclosure in the context of optical lithography, it will be appreciated that the disclosure may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens," where the context allows, may refer to any one or a combination of various types of optical components, including refractive, reflective, magnetic, electromagnetic and electrostatic optical components. Reflective components are likely to be used in an apparatus operating in the UV and/or EUV ranges.

The breadth and scope of the present disclosure should not be limited by any of the above described exemplary embodiments, but should be defined only in accordance with the following claims and their equivalents.

While the concepts disclosed herein may be used on a substrate such as a silicon wafer, it shall be understood that the disclosed concepts may be used with any type of lithographic systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

The invention claimed is:

1. A method comprising:
   a) obtaining an initial version of a characteristic function of an initial version of a metrology mark disposed within a layer stack for use in a lithography process, the initial version of the metrology mark comprising a plurality of mark segments, at least one of the mark segments comprising a plurality of subsegments, wherein the characteristic function comprises:
      a change in a wavelength of a reflected beam with respect to the wavelength of an incident radiation as a function of a change in thickness of the layer stack, the reflected beam being a beam reflected from the metrology mark and passing through the layer stack, or
      a change in angular reflectance of the reflected beam as a function of a change in thickness of the stack;
   b) perturbing one or more variables of the plurality of subsegments, wherein the one or more variables comprise pitch, duty cycle, and/or line width of the plurality of subsegments;
   c) perturbing a thickness of one or more layers within the layer stack;
   d) updating, by a hardware computer, the characteristic function based upon the perturbations of b) and c);
   e) iteratively performing steps b), c) and d) until a further version of the characteristic function is determined to set a configuration for the plurality of subsegments; and
   f) physically creating a metrology mark instance having the configuration for the plurality of subsegments, physically creating a patterning device to create at least part of the metrology mark instance, or providing a signal representing, or based on, the configuration for the plurality of subsegments to a tool or system for use by the tool or system to enable creation of the metrology mark instance or of the patterning device.

2. The method of claim 1, wherein the characteristic function comprises the change in a wavelength of a reflected beam with respect to the wavelength of an incident radiation as a function of a change in thickness of the layer stack.

3. The method of claim 1, wherein the characteristic function comprises the change in angular reflectance of the reflected beam as a function of a change in thickness of the stack.

4. The method of claim 1, wherein the pitch and duty cycle remain constant and wherein the line width of the plurality of subsegments is varied.

5. The method of claim 1, wherein the pitch and line width remain constant and wherein the duty cycle of the plurality of subsegments is varied.

6. The method of claim 1, wherein the line width and duty cycle remain constant and wherein the pitch of the plurality of subsegments is varied.

7. The method of claim 1, wherein e) is performed a predetermined number of times before the further version of the characteristic function is determined.

8. A computer program product comprising a non-transitory computer readable medium having instructions therein, the instructions, when executed by a computer system, configured to cause the computer system to at least:
   a) obtain an initial version of a characteristic function of an initial version of a metrology mark disposed within a layer stack for use in a lithography process, the initial version of the metrology mark comprising a plurality of mark segments, at least one of the mark segments comprising a plurality of subsegments, wherein the characteristic function comprises:
      a change in a wavelength of a reflected beam with respect to the wavelength of an incident radiation as a function of a change in thickness of the layer stack, the reflected beam being a beam reflected from the metrology mark and passing through the layer stack, or
      a change in angular reflectance of the reflected beam as a function of a change in thickness of the stack;
   b) perturb one or more variables of the plurality of subsegments, wherein the one or more variables comprise pitch, duty cycle, and/or line width of the plurality of subsegments;
   c) perturb a thickness of one or more layers within the layer stack;
   d) update the characteristic function based upon the perturbations of b) and c);
   e) iteratively perform b), c) and d) until a further version of the characteristic function is determined to set a configuration for the plurality of subsegments; and
   f) cause physical creation of a metrology mark instance having the configuration for the plurality of subsegments, cause physical creation of a patterning device to create at least part of the metrology mark instance, or provide a signal representing, or based on, the configuration for the plurality of subsegments to a tool or system for use by the tool or system to enable creation of the metrology mark instance or of the patterning device.

9. The computer program product of claim 8, wherein the characteristic function comprises the change in a wavelength of a reflected beam with respect to the wavelength of an incident radiation as a function of a change in thickness of the layer stack.

10. The computer program product of claim 8, wherein the characteristic function comprises the change in angular reflectance of the reflected beam as a function of a change in thickness of the stack.

11. The computer program product of claim 8, wherein the pitch and duty cycle remain constant and wherein the line width of the plurality of subsegments is varied.

12. The computer program product of claim 8, wherein the pitch and line width remain constant and wherein the duty cycle of the plurality of subsegments is varied.

13. The computer program product of claim 8, wherein the line width and duty cycle remain constant and wherein the pitch of the plurality of subsegments is varied.

14. A computer program product comprising a non-transitory computer readable medium having instructions therein, the instructions, when executed by a computer system, configured to cause the computer system to at least:
   obtain an initial version of a characteristic function of a metrology mark disposed within a layer stack for use in a lithography process, wherein the characteristic function comprises:
      a change in a wavelength of a reflected beam with respect to the wavelength of an incident radiation as a function of a change in thickness of the layer stack, the reflected beam being a beam reflected from the metrology mark and passing through the layer stack, or a change in angular reflectance of the reflected beam as a function of a change in thickness of the stack;

iteratively perturb one or more variables of the metrology mark and/or of the layer stack and update the characteristic function based upon the perturbation, until a further version of the characteristic function is determined to set a configuration for the metrology mark; and cause physical creation of a metrology mark instance having the configuration for the metrology mark, cause physical creation of a patterning device to create at least part of the metrology mark instance, or provide a signal representing, or based on, the configuration for the metrology mark to a tool or system for use by the tool or system to enable creation of the metrology mark instance or of the patterning device.

15. The computer program product of claim 14, wherein the perturbation of one or more variables of the metrology mark and/or of the layer stack comprises perturbation of a thickness of one or more layers within the layer stack.

16. The computer program product of claim 14, wherein the characteristic function comprises the change in a wavelength of a reflected beam with respect to the wavelength of an incident radiation as a function of a change in thickness of the layer stack.

17. The computer program product of claim 14, wherein the characteristic function comprises the change in angular reflectance of the reflected beam as a function of a change in thickness of the stack.

18. The computer program product of claim 14, wherein the initial version of the metrology mark comprises a plurality of mark segments, at least one of the mark segments comprising a plurality of subsegments, and wherein the perturbation of one or more variables of the metrology mark and/or of the layer stack comprises perturbation of one or more variables of the plurality of subsegments, wherein the one or more variables comprise pitch, duty cycle, and/or line width of the plurality of subsegments.

19. The computer program product of claim 18, wherein the pitch and duty cycle remain constant, wherein the line width of the plurality of subsegments is varied and wherein the perturbation of one or more variables of the metrology mark and/or of the layer stack comprises perturbation of a variable of one or more layers within the layer stack.

20. The computer program product of claim 18, wherein the pitch and line width remain constant, wherein the duty cycle of the plurality of subsegments is varied and wherein the perturbation of one or more variables of the metrology mark and/or of the layer stack comprises perturbation of a variable of one or more layers within the layer stack.

* * * * *